(12) United States Patent
Mendel et al.

(10) Patent No.: US 9,490,836 B2
(45) Date of Patent: *Nov. 8, 2016

(54) APPARATUS FOR IMPROVED ENCODING AND ASSOCIATED METHODS

(71) Applicant: Altera Corporation, San Jose, CA (US)

(72) Inventors: David Mendel, Sunnyvale, CA (US); Gregg W. Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 587 days.

This patent is subject to a terminal disclaimer.

(21) Appl. No.: 13/661,313

(22) Filed: Oct. 26, 2012

(65) Prior Publication Data

US 2014/0119388 A1 May 1, 2014

(51) Int. Cl.
*H04J 3/00* (2006.01)
*H03M 5/14* (2006.01)

(52) U.S. Cl.
CPC ................................... *H03M 5/145* (2013.01)

(58) Field of Classification Search
CPC .. H04L 25/08; H03M 5/145; G11B 20/1426; G11B 15/463
USPC ....................................................... 370/476
See application file for complete search history.

(56) References Cited

U.S. PATENT DOCUMENTS

| | | | |
|---|---|---|---|
| 4,486,739 A * | 12/1984 | Franaszek | H04L 25/4908 341/59 |
| 4,547,890 A * | 10/1985 | Gindi | H03M 5/145 341/58 |
| 5,022,051 A | 6/1991 | Crandall et al. | |
| 5,175,545 A * | 12/1992 | Uchiyama | H03M 5/145 341/59 |
| 5,446,765 A | 8/1995 | Leger | |
| 5,668,545 A * | 9/1997 | Chen | G11B 5/588 341/50 |
| 6,304,196 B1 * | 10/2001 | Copeland et al. | 341/58 |
| 7,035,292 B1 * | 4/2006 | Giorgetta et al. | 370/509 |
| 7,061,406 B1 | 6/2006 | Dally | |
| 7,782,805 B1 | 8/2010 | Belhadj et al. | |
| 7,786,902 B1 * | 8/2010 | Oberg | H03M 5/145 341/50 |
| 2006/0171234 A1 | 8/2006 | Liu et al. | |
| 2009/0034728 A1 | 2/2009 | Goergen et al. | |
| 2009/0177948 A1 * | 7/2009 | Fischer et al. | 714/776 |
| 2010/0027625 A1 * | 2/2010 | Wik et al. | 375/240.12 |
| 2011/0173516 A1 * | 7/2011 | Geng et al. | 714/775 |
| 2012/0023059 A1 * | 1/2012 | Morgan et al. | 706/52 |

FOREIGN PATENT DOCUMENTS

| | | |
|---|---|---|
| EP | 0097763 A2 | 2/1983 |
| EP | 0097763 A3 | 2/1983 |

(Continued)

OTHER PUBLICATIONS

*Scalable Serdes Framer Interface (SFI-S): Implementation Agreement for Interfaces beyond 40G for Physical Layer Device*, Optical Internetworking Forum, 32 pp. (Nov. 2008), available at www.oiforum.com/public/documents/OIF_SFI-S_01.0_IA.pdf.

(Continued)

*Primary Examiner* — Khaled Kassim
*Assistant Examiner* — Syed S Ali

(57) ABSTRACT

An apparatus includes an encoder adapted to encode data bits for transmission via a communication link. The encoder includes a logic circuit. The logic circuit is adapted to perform a logic operation on a pattern of bits and the data bits in order to reduce a run-length of the data bits.

24 Claims, 18 Drawing Sheets

(56) References Cited

FOREIGN PATENT DOCUMENTS

| WO | 2009017800 A2 | 2/2009 |
|---|---|---|
| WO | 2009017800 A3 | 2/2009 |

OTHER PUBLICATIONS

*Serdes Framer Interface Level 5 (SFI-5): Implementation Agreement for 40Gb/s Interface for Physical Layer Devices*, Optical Internetworking Forum, 62 pp. (Jan. 2002), available at www.oiforum.com/public/documents/OIF-SFI5-01.0.pdf.
*Interlaken Protocol Definition, A Joint Specification of Cortina Systems and Cisco Systems*, Rev. 1.2, 52 pp. (Oct. 7, 2008), available at www.interlakenalliance.com/Interlaken_Protocol_Definition_v1.2.pdf.
Sowmya S. Luckoor, *Introduction to 10 Gigabit 64b/66b (Clause 49)*, 30 pp. (Oct. 22, 2001), available at www.iol.unh.edu/services/testing/10gec/training/10GbE_C149.pdf.
Rick Walker et al., *64b/66b coding update*, 19 pp. (Mar. 6, 2000), available at www.omnisterra.com/walker/pdfs.talks/albuquerque.pdf.
Search report in EP application No. 2725716A1, Feb. 3, 2014, 6 pgs.
Eric Tell et al., "A Hardware Architecture for a Multi Mode Block Interleaver," Nov. 3, 2004, 4 pgs.
U.S. Appl. No. 14/142,639, filed Dec. 2013, Mendel.
Office communication in U.S. Appl. No. 14/142,639, filed Jul. 31, 2015, 25 pgs.
Search report in EP application No. 14199921, Sep. 28, 2015, 9 pgs.
"DC Bias," Wikipedia, Sep. 2015, 4 pgs.

* cited by examiner

Data: {01000100000000000000010111010101011} (run-length: 14)
Input Signal: {01010101010101010101010101010101} (run-length: 7)
Encoded Data: {00010001010101010101011011111110}

Input Data: {01000 10000 00000 00000 10111 01010 11} (run-length: 14)

Ordering: {1, 6, 11, 16, 21, 26, 31,
5, 10, 15, 20, 25, 30,
4, 9, 14, 19, 24, 29,
3, 8, 13, 18, 23, 28,
2, 7, 12, 17, 22, 27}

Output Data: {0100101 000010 000011 000010 1000011} (run-length: 4)

Fig. 6

Original Data: {0100010000000000000010111010101011} (run-length: 14)

Input Signal: {0101010101010101010101010101010101}

After XOR: {0001000101010101010101011011111110} (run-length: 7)

Ordering: {1, 2, 11, 12, 21, 22, 31, 32,
9, 10, 19, 20, 29, 30,
7, 8, 17, 18, 27, 28,
5, 6, 15, 16, 25, 26,
3, 4, 13, 14, 23, 24}

Output Data: {0001011001011101011000111010110} (run-length: 3)

Fig. 12

Original Data Bits: 0011 1100 0000 0000 0000 0000 1111

Outputs of Circuit 350A-350K: X X 0 0 0 0 0 1

Fig. 18

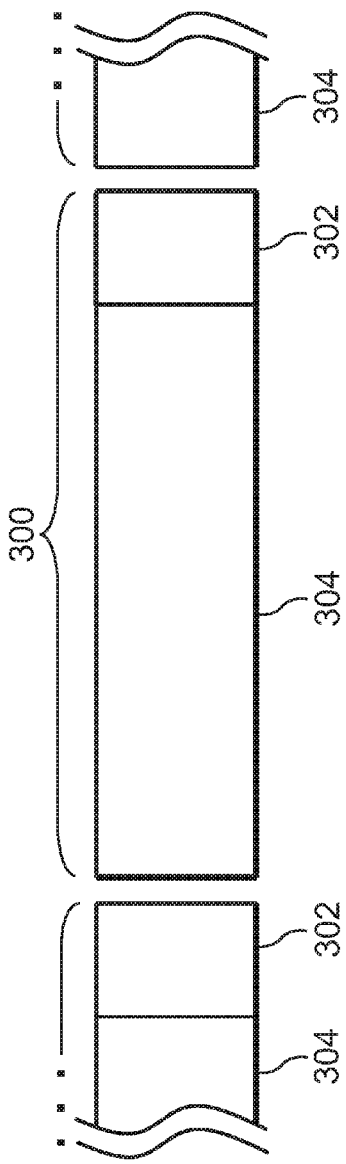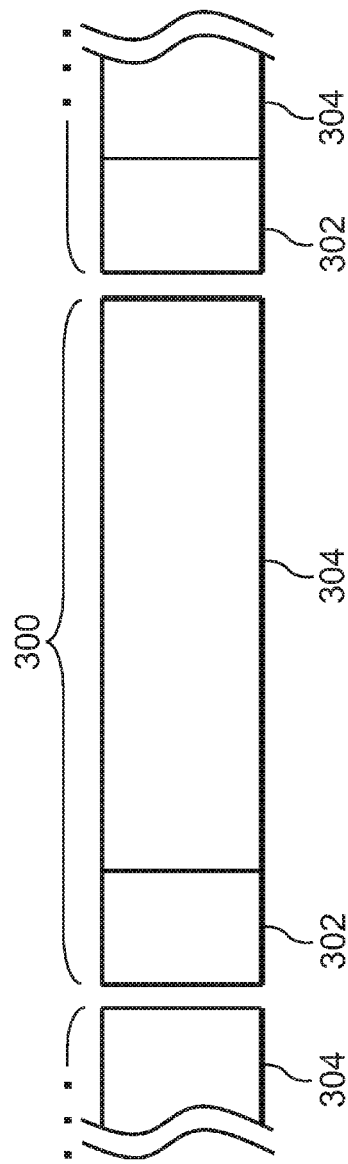

APPARATUS FOR IMPROVED ENCODING AND ASSOCIATED METHODS

TECHNICAL FIELD

The disclosed concepts relate generally to electronic communication and, more particularly, to apparatus for improved coding in electronic communication, and associated methods.

BACKGROUND

Electronic circuitry and systems sometimes use a high speed link to facilitate communication between two circuits or subsystems. The link, which might be a serial link, may communicate information or data with encoding added by a transmitter that may indicate word-boundaries, distinguish data and control information, scramble the data to spread out electromagnetic interference (EMI), avoid long run-lengths, and balance the number of zeros and ones to avoid a DC imbalance. Examples of encoding schemes include 8b10b, 64/66, and 64/67, which are well known to persons of ordinary skill in the art.

At the receiver, the data communicated via the link are processed to determine word boundary, obtain lock with the transmitter, decode, etc. Once word lock is found, the data transitions are used to confirm that word-lock is maintained. The details of those operations are well known to persons of ordinary skill in the art.

SUMMARY

Apparatus and associated methods are disclosed for improved coding in electronic communication. In an exemplary embodiment, an apparatus includes an encoder circuit that includes a logic circuit. The encoder circuit is adapted to encode data bits for transmission via a communication link. The logic circuit is adapted to perform a logic operation on a pattern of bits and the data bits in order to reduce a run-length of the data bits. In another exemplary embodiment, an apparatus includes an encoder circuit adapted to encode data bits for transmission via a communication link. The encoder circuit includes a bit order scrambling circuit. The bit order scrambling circuit is adapted to scramble an order of the data bits in order to reduce a run-length of the data bits. In yet another exemplary embodiment, an apparatus includes an encoder to encode a set of data bits. The encoder is adapted to encode the data bits selectively based on a set of bits. The set of bits are used initially to establish data communication via a link.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIG. 6 depicts an example of using scrambling of the bit ordering according to an exemplary embodiment to reduce run-length.

FIG. 12 illustrates an example of using scrambling of the bit ordering as well as a logic operation to reduce run-length according to an exemplary embodiment.

FIG. 15 illustrates the configuration of information bits or packets according to an exemplary embodiment.

FIG. 16 depicts the configuration of information bits or packets according to another exemplary embodiment.

FIG. 18 illustrates an example of approximating run-length according to an exemplary embodiment.

DETAILED DESCRIPTION

The disclosed concepts relate generally to improved communication in electronic circuitry or systems by improving the coding scheme used. More specifically, as described below in detail, the disclosed concepts provide apparatus and methods for a variety of data encoding schemes that provide several advantages, such as relatively low run-lengths (RL), relatively high transition density, relatively uniform transition density, relatively low overhead, and/or maintaining DC balance (or nearly or substantially maintaining DC balance). In some embodiments, the data encoding schemes may be used individually. Alternatively, in some embodiments, two or more of the encoding schemes may be combined or used together.

Run-length is a measure of a series of consecutive 0s or 1s in communicated data. Longer run-length sequences are usually more challenging for a receiver to properly detect. Shorter run-lengths allow successful communication over longer distances, for example, over a 20" backplane, rather than a 10" backplane (as might be the case with longer run-lengths). As a result of shorter run-lengths, high speed links work better over challenging connections, such as a backplane. Running disparity (RD) is a measure of the imbalance between 0s and 1s. For example, a transmission that includes 450 0s and 550 1s has a running disparity of +100, and an imbalance of (100/1000)×100%, or 10%.

Figure 1:
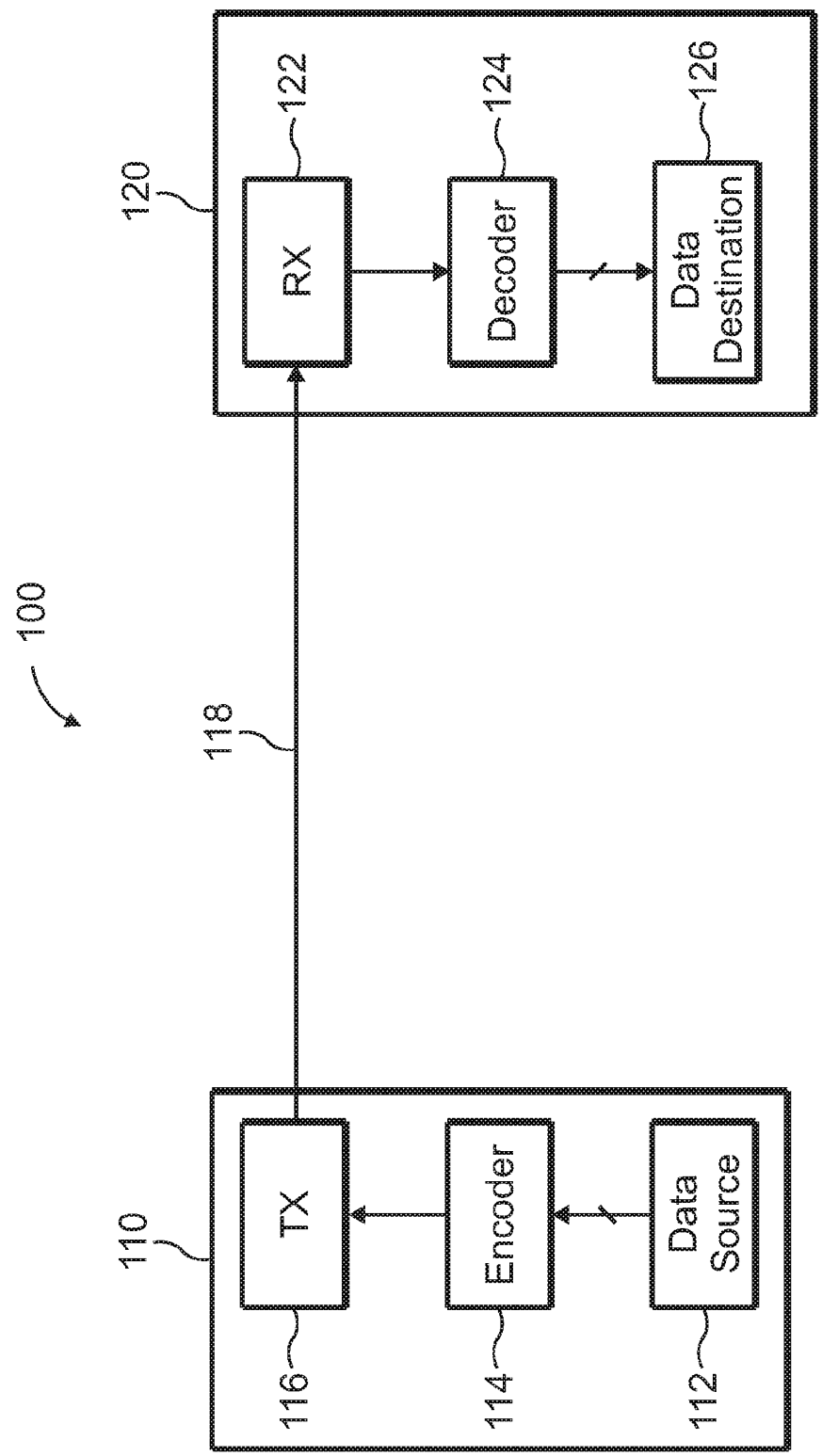
FIG. 1 illustrates a block diagram of a data communication system according to an exemplary embodiment.

The encoding schemes may be used in a variety of data communication circuitry and systems. FIG. 1 illustrates a data communication system 100 according to an exemplary embodiment.

System 100 includes a data transmitter 110 coupled to a data receiver 120 via link 118. In some exemplary embodiments, data transmitter 110 may reside in the same physical enclosure or package as data receiver 120. As one example, data transmitter 110 and data receiver 120 may reside within a rack-mounted system or instrument. As another example, data transmitter 110 and data receiver 120 may reside on separate dies (or the same die) within a multi-chip module (MCM). As yet another example, data transmitter 110 and data receiver 120 may reside on or within the same die within an integrated circuit (IC). As an additional example, data transmitter 110 and data receiver 120 may reside on or within a three-dimensional (3D) package or assembly that includes one or more die, a package substrate, etc. Other variations and configurations are possible, as persons of ordinary skill in the art understand.

In some exemplary embodiments, data transmitter 110 may reside in a different physical enclosure or package than data receiver 120. As an example, data transmitter 110 may reside in a different physical enclosure or package that couples via a backplane to a physical enclosure or package that houses or includes data receiver 120. As another example, data transmitter 110 may reside in a different physical enclosure or package that couples via a cable, optical fiber, or other mechanism to a physical enclosure or package that houses or includes data receiver 120.

Encoder 114 receives data from a data source 112, and encodes the data. The encoding, described below in detail, provides some or all of the advantages mentioned above. Encoder 114 provides encoded data to transmitter circuit 116. Transmitter circuit 116 communicates the encoded data to data receiver 120 via link 118.

Data receiver 120 receives the encoded data from link 118 via receiver circuit 122. Receiver circuit 122 provides the coded data to decoder 124. Decoder 124 decodes the data, and provides the decoded data to data destination 126. Data destination 126 may include circuitry or a subsystem that ultimately (or as an intermediate destination) receives and/or uses the decoded data.

Link 118 may have a variety of forms. Generally, link 118 includes one or more coupling mechanisms, such as wires, cables, printed-circuit board (PCB) traces, optical fiber(s), conductors or semiconductors in ICs, MCMs, 3-dimensional (3D) packages and/or assemblies, and the like, to facilitate the communication of data, status, and/or control signals. In exemplary embodiments, data transmitter 110 uses serial communication to provide the encoded data to data receiver 120. As persons of ordinary skill in the art would understand, however, one may use other communication protocols, or schemes, as desired. For example, in some embodiments, the communication may occur between ICs, between subsystems, and/or between systems. The ICs, subsystems, and systems may include electrical circuitry, optical devices or circuitry, or a combination, as desired.

Figure 2:
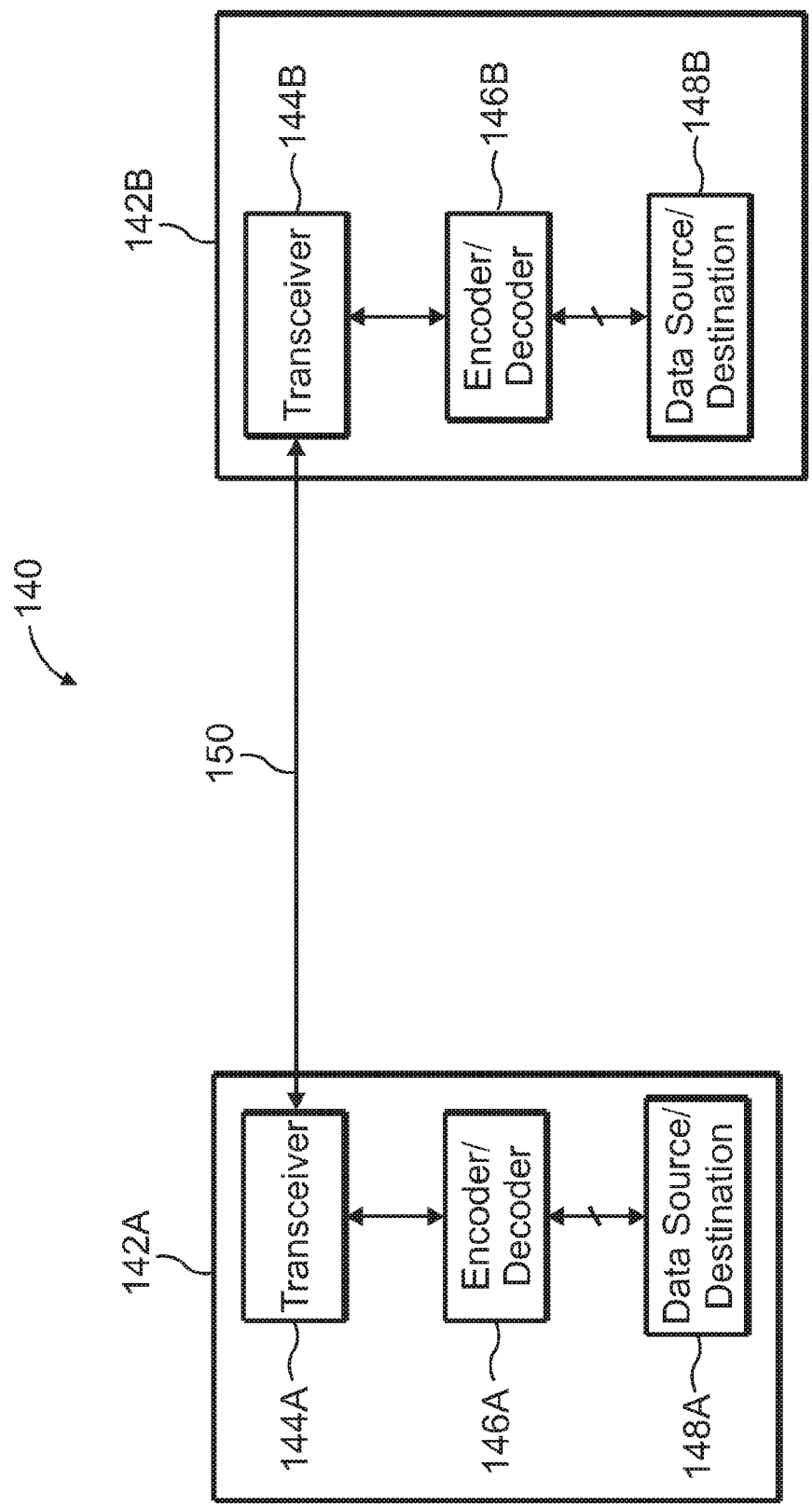
FIG. 2 depicts a block diagram of a data communication system according to another exemplary embodiment.

FIG. 2 illustrates a data communication system 140 according to an exemplary embodiment. In this embodiment, a pair of data transceivers 142A-142B take advantage of the encoding schemes (and the corresponding decoding schemes) for improved performance. In other words, unlike the unidirectional system 100 in FIG. 1, system 140 provides a bidirectional communication link between data transceivers 142A-142B.

Referring to FIG. 2, system 140 includes data transceiver 142A coupled to data transceiver 142B via link 150. In some exemplary embodiments, data transceiver 142A may reside in the same physical enclosure or package as data transceiver 142B. As one example, data transceiver 142A and data transceiver 142B may reside within a rack-mounted system or instrument. As another example, data transceiver 142A and data transceiver 142B may reside on separate die (or the same die) within an MCM, 3D package or assembly, etc., as desired. As yet another example, data transceiver 142A and data transceiver 142B may reside on or within the same die or IC.

In some exemplary embodiments, data transceiver 142A may reside in a different physical enclosure or package than data transceiver 142B. As an example, data transceiver 142A may reside in a different physical enclosure or package that couples via a backplane to a physical enclosure or package that houses or includes data transceiver 142B. As another example, data transceiver 142A may reside in a different physical enclosure or package that couples via a cable, optical fiber, or other mechanism to a physical enclosure or package that houses or includes data transceiver 142B.

As noted, communication between data transceivers 142A-142B may occur in two directions, from data transceiver 142A to data transceiver 142B, or vice-versa. Considering the first scenario, encoder/decoder 146A receives data from a data source/destination 148A, and encodes the data (for ultimate transmission to data transceiver 142B). Note that the encoding may be performed by encoding circuitry within encoder/decoder 146A, which may be similar to encoder 114 (see FIG. 1). The encoding, described below in detail, provides some or all of the advantages mentioned above. Encoder/decoder 146A provides encoded data to transceiver circuit 144A. Transceiver circuit 144A communicates the encoded data to data transceiver 142B via link 150.

Data transceiver 142B receives the encoded data from link 150 via transceiver circuit 144B. Transceiver circuit 144B provides the coded data to encoder/decoder 146B. Encoder/decoder 146B decodes the data, and provides the decoded data to data source/destination 148B. Note that the decoding may be performed by decoding circuitry within encoder/decoder 146B, which may be similar to decoder 124 (see FIG. 1). Data source/destination 148B may include circuitry or a subsystem that ultimately (or as an intermediate destination) receives and/or uses the decoded data.

In the second scenario, information flows from data transceiver 142B to data transceiver 142A. Encoder/decoder 146B receives data from a data source/destination 148B, and encodes the data (for ultimate transmission to data transceiver 142A). The encoding, described below in detail, provides some or all of the advantages mentioned above. Note that the encoding may be performed by encoding circuitry within encoder/decoder 146B, which may be similar to encoder 114 (see FIG. 1). Encoder/decoder 146B provides encoded data to transceiver circuit 144B. Transceiver circuit 144B communicates the encoded data to data transceiver 142A via link 150.

Data transceiver 142A receives the encoded data from link 150 via transceiver circuit 144A. Transceiver circuit 144A provides the coded data to encoder/decoder 146A. Encoder/decoder 146A decodes the data, and provides the decoded data to data source/destination 148A. Note that the decoding may be performed by decoding circuitry within encoder/decoder 146A, which may be similar to decoder 124 (see FIG. 1). Data source/destination 148A may include circuitry or a subsystem that ultimately (or as an intermediate destination) receives and/or uses the decoded data.

Link 150 may have a variety of forms. Generally, link 150 includes one or more coupling mechanisms, such as wires, cables, printed-circuit board (PCB) traces, conductors or semiconductors in ICs, MCMs, 3D packages or assemblies, and the like, to facilitate the communication of data and status or control signals. In exemplary embodiments, data transceiver 142A uses serial communication to provide the encoded data to data transceiver 142B, or vice-versa. As persons of ordinary skill in the art would understand, however, one may use other communication protocols, or schemes, as desired.

In exemplary embodiments, other operations may take place, such as finding word boundaries, establishing lock or synchronization between data transmitters (or transceivers) and data receivers (or transceivers), and the like. Details of those operations and their respective implementations are known to persons of ordinary skill in the art. Furthermore, the transmitter (or transmitting transceiver) and the receiver (or receiving transceiver) may auto-negotiate some parameters for an improved or better communication link, e.g., a running disparity offset other than zero, or the bias between running disparity and run-length, etc.

Figures 3, 4:
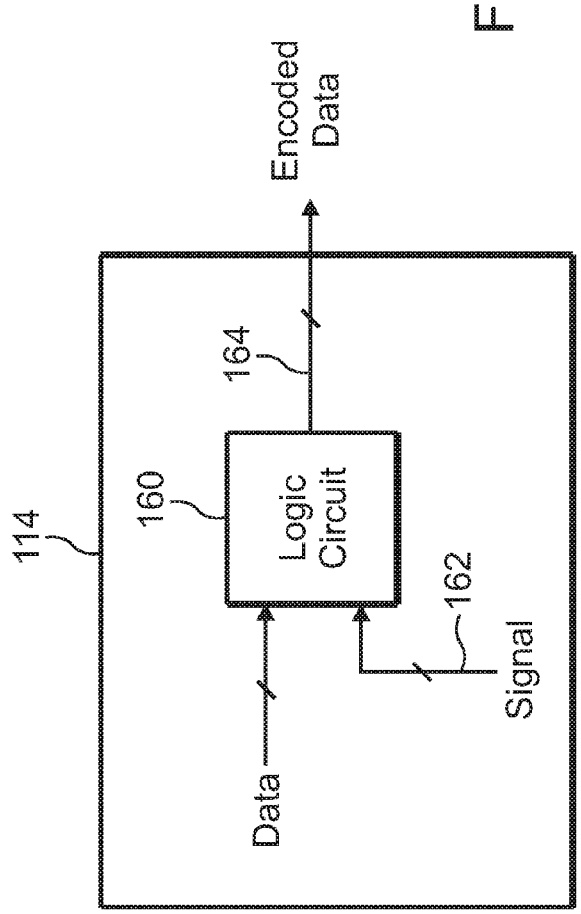
FIG. 3 shows a block diagram of a circuit for encoding according to an exemplary embodiment.
FIG. 4 depicts an example of using a logic operation according to an exemplary embodiment to reduce run-length.

One technique for obtaining improved run-length involves performing one or more logical operations on the data before transmission of data. More specifically, a logical operation may be performed between the data and another signal, e.g., a clock signal, to improve the run-length. FIG. 3 shows this technique according to an exemplary embodiment.

More specifically, the circuit arrangement in FIG. 3 shows part of encoder 114 (see FIG. 1) although, as persons of ordinary skill in the art understand, a similar arrangement may be used to implement encoding (e.g., by using encoder/decoder 146A and/or 146B) in the embodiment shown in FIG. 2. Encoder 114 includes logic circuit 160 which, in the example shown, has two inputs. One input of logic circuit 160 receives the data to be communicated. Another input of logic circuit 160 receives an input signal 162 (for example, received from a controller (not shown) or other source), such as a clock or encoding signal. In response to the inputs, logic circuit 160 performs a logical operation on the data and the input signal, and provides the result as an output (encoded data).

In exemplary embodiments, logic circuit 160 may perform a variety of logic operations. In some embodiments, logic circuit 160 may perform more than one logic operation on the data, or on intermediate results of a logic operation on the data. In some embodiments, logic circuit 160 may perform the logic operation in a programmable or configurable manner, for example, in response to control signal(s), commands, etc., provided from one or more source(s), for example, a controller (not shown).

In one exemplary embodiment, logic circuit 160 performs an exclusive OR (XOR) operation on the data and the input signal. As a result of this operation, the run-length of the encoded data may be reduced (note that, as described below, depending on the result of the operation, the protocol may determine, for example, on a word-by-word basis, whether the original data or the result(s) of one or more operations has a lower run-length and, based on that determination, choose or select the desired operation (if any) to be performed on the data bits. FIG. 4 shows an example of this operation.

Specifically, FIG. 4 shows a set of data bits that, if transmitted without encoding, have a run-length of 14. The underlined portion of the data bits shows a series of 14 consecutive 0s, hence a run-length of 14. Logic circuit 160 (not shown in FIG. 4) performs an XOR operation between the data and the input signal (e.g., a clock signal, as noted above). In the example shown, the input signal includes an alternating pattern of 0s and 1s, which may correspond to the logic levels of a clock signal or other input signal. The result, the encoded data, represents a bit-wise XOR operation between the data and the input signal.

As FIG. 4 illustrates, the encoded data have a run-length of 7. Specifically, the encoded data include a pattern of seven 1s, i.e., a run-length of 7. By using the example XOR operation to encode the original data, the embodiment shown in FIG. 3 reduces the run-length of the resulting data. Put another way, the operation converts the portion of the bit pattern that is constant to an alternating pattern, whereas the remaining bits have the same probabilistic distribution they did before the XOR operation.

Note that, given a random data pattern, applying the XOR operation (or other logic operation, generally) has an equal chance of making the maximum run-length either longer or shorter. For example, applying the pattern to {0101010101} might turn a short run-length pattern into a long run-length pattern. Thus, in some embodiments, the logic operation (e.g., XOR) may be applied when the original data have a relatively long run-length (e.g., RL>K, where K represents a constant or variable).

As an alternative, in some embodiments, run-length may be computed for the original data before the application of the logic operation, and also for the result of applying the logic operation to the data. A selection or choice may be made between those two results, depending on which provides a better (shorter) run-length, for example, by using a single bit or a set of one or more bits. Assuming the scenario where the shorter run-length is chosen, the odds of a run of length of r starting at any given position for relatively large values of r (for example, r>20) is approximately $2^{-r}$ for the original data (which may or may not have been encoded). But the odds of a run of length of r starting at any given position is reduced to $2^{-2r}$ after the application of the encoding scheme described above. For r=20, the encoding scheme provides three orders of magnitude decrease in the probability of this run-length occurring (i.e., 1,000-fold decrease). For r=40, the encoding scheme provides six orders of magnitude improvement in the probability of this long run-length occurring (i.e., 1,000,000-fold decrease).

The concept described above may be used in a variety of situations and embodiments. For example, the logic operation (e.g., XOR) may be used on data that already have or include some kind of encoding. As another example, the logical operation may be an operation other than XOR, for example, exclusive NOR (XNOR), etc., or a complex logic operation, for example, an operation described by a Boolean logic expression. Furthermore, a variety of bit patterns may be used for the input signal, rather than the example alternating binary 0s and 1s (clock pattern) shown in FIG. 4. For example, the pattern 001100110011 (a half-cycle clock), a semi-random or pseudo-random pattern, or any other desired pattern may be used. The length of the pattern may be the number of data bits in the payload or data. As yet another example, the encoding scheme may be used in a transceiver, rather than a transmitter, for example, in an encoder or encoder/decoder block (see FIG. 2).

As persons of ordinary skill in the art understand, in some protocols, e.g. Interlaken, PCIe gen3, or SONET, the data are scrambled by with a linear feedback shift-register (LFSR). The LFSR is characterized by the polynomial and the initialization seed. The pattern of bits that are transmitted for a given word are a function of the current state of the LFSR. If two LFSRs, e.g., LFSR$_1$ and LFSR$_2$, are used, for example, operating in parallel and with different initialization seed, then a choice may be made between LFSR$_1$ and LFSR$_2$ based on various selection criteria, such as run-length, DC-wander, or other criteria, as desired.

Another encoding technique uses scrambling of the bit ordering (or re-ordering of the data bits), i.e., changing or scrambling or re-ordering the order of the data bits. Given a sequence of data bits that has a relatively long run-length, scrambling the order of the bits separates out the constant bits, thus on average reducing the run-length. The optimal scheme for scrambling depends on the maximum run-length that is to be avoided or is undesired, and on the payload or data size.

Figure 5:
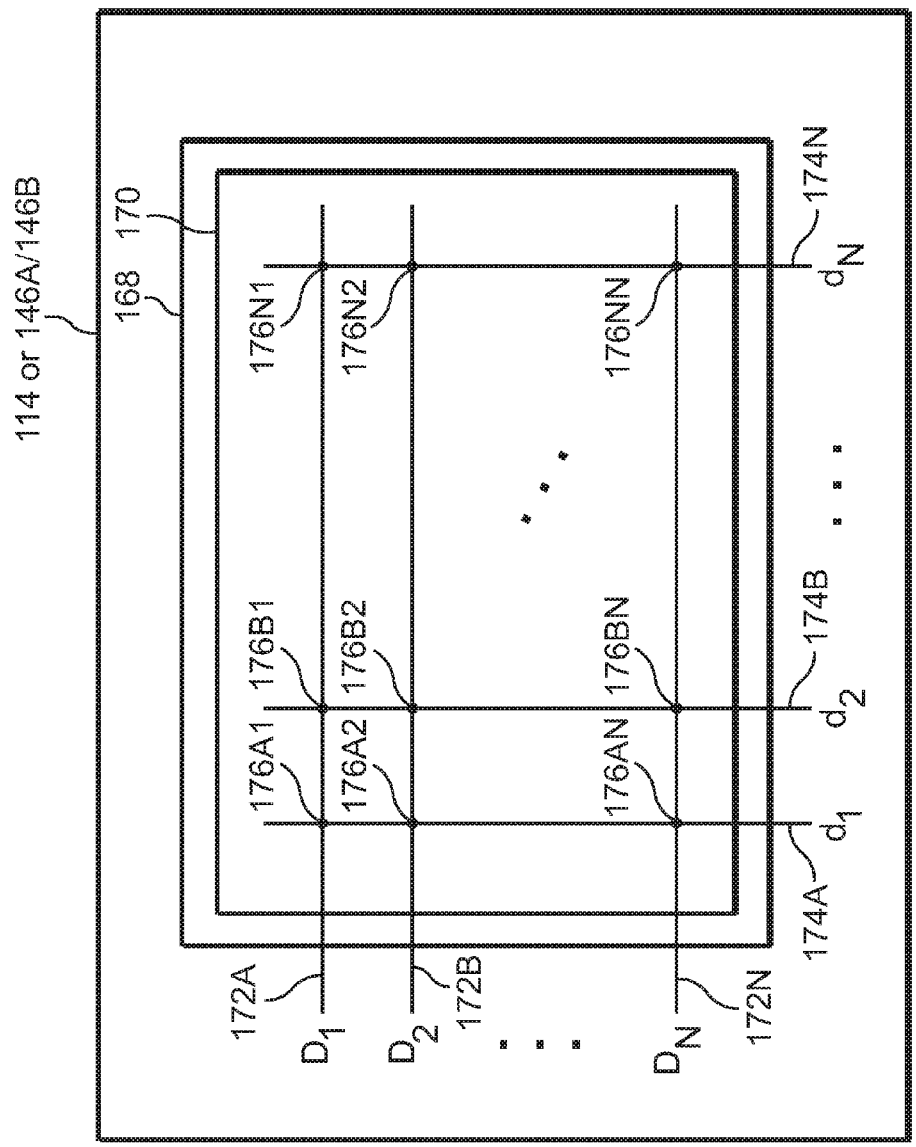
FIG. 5 illustrates a block diagram of a circuit for scrambling bit orders or re-ordering bits according to an exemplary embodiment.

Bit order scrambling may be implemented in a variety of ways. Generally, a circuit, such as a bit order scrambling circuit, however implemented, may receive the data bits, and then scramble the order to produce or output encoded or scrambled-order data bits. In typical implementations, a bit would have a choice of going to one of two locations, assuming a single bit choice, or perhaps as many as 2-3 locations. In such a situation, a multiplexer (MUX) may be used to implement or realize bit order scrambling. For a more general implementation that can accommodate virtually any bit order permutation or ordering, a circuit using a switch matrix, as shown in FIG. 5, may be employed. Specifically, encoder 114 (if, for example, system 100 in FIG. 1 is used) or encoder/decoder 146A/146B (if, for example, system 140 in FIG. 2 is used) includes a bit ordering block or circuit 168. Bit ordering block 168 includes switch matrix 170. Switch matrix 170 in FIG. 5 allows any given data bit, say, bit 1, to be output or re-ordered to any arbitrary new position, for example, to bit 12.

Switch matrix 170 includes a circuit or network of switches, labeled 176A1-176NN. Switches 176A1-176NN are coupled to a series of data bit lines 172A-172N (e.g., rows) and 174A-174N (e.g., columns). Each of switches 176A1-176NN may selectively (e.g., under the control of a controller or similar circuit (not shown)) couple a respective one of lines 172A-172N to a respective one of lines 174A-174N.

Original (input) data bits, denoted as $D_1$-$D_N$ in FIG. 5, are coupled to lines 172A-172N. By closing selected or desired switches, input bits $D_1$-$D_N$ may be coupled to respective desired or selected output lines (174A-174N) to provide output or encoded data bits $d_1$-$d_N$. For example, by closing switch 176B1, input data bit $D_1$ is output as output data bit $d_2$. As another example, by closing switch 176AN, input data bit $D_N$ is output as output data bit $d_1$, etc.

As persons of ordinary skill in the art would understand, MUXs and the circuit in FIG. 5 represent merely exemplary implementations of data bit order scrambling. Other circuits or schemes may be used, depending on factors such as specifications for a given implementation, available technology, semiconductor fabrication process characteristics, desired speed of operation, etc. Examples include multiplexers, Boolean logic circuits, shift registers (e.g., linear feedback shift registers), look-up tables, finite-state machines, and the like.

Bit order scrambling may be performed using a variety of bit order scrambling schemes (for example, ways to control the switches in the circuit of FIG. 5 or to process the bits using a MUX, as described above). As one example, an order scrambling on a 32-bit payload may use:

new-bit-position(x)={old-bit-position(x)×5} mod 32, where new-bit-position and old-bit-position represent, respectively, the position of bit x after and before the encoding. Since the numbers 5 and 32 are relatively prime, this bit order scrambling provides a full re-ordering of the data bits. The numbers 5 and 32 constitute merely illustrative numbers used in some embodiments. Other numbers, such as other relative prime numbers, may be used in other exemplary embodiments, as persons of ordinary skill in the art understand.

FIG. 6 shows an example of data order scrambling according to the scheme described above. Specifically, FIG. 6 shows a set of input data bits that, if transmitted without this encoding scheme (scrambling), have a run-length of 14. The encoding scheme described above is applied to the data bits. In this example, the ordering or bit order scrambling used is {1, 6, 11, 16, 21, 26, 31, 5, 10, 15, 20, 25, 30, 4, 9, 14, 19, 24, 29, 3, 8, 13, 18, 23, 28, 2, 7, 12, 17, 22, 27}. The result, the encoded data, represents the original data bits reordered according to the above pattern or order. As FIG. 6 illustrates, the encoded data have a run-length of 4. Specifically, the encoded data include the pattern "0000," i.e., a run-length of 4. By using the example reordering shown to encode the original data, the example shown in FIG. 6 reduces the run-length of the resulting data.

Figure 7:
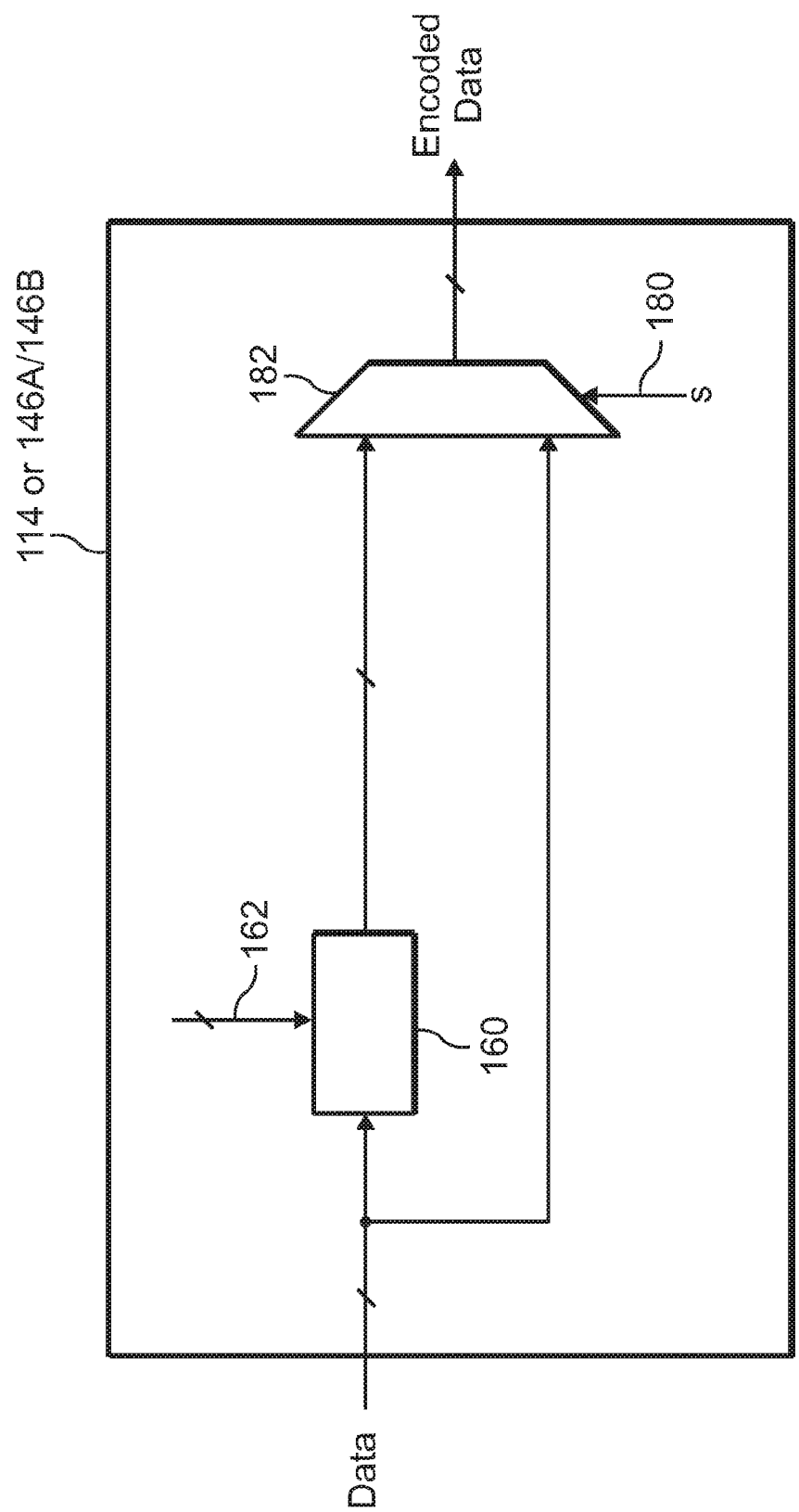
FIG. 7 shows a circuit according to an exemplary embodiment for selectively using encoding via a logic operation.

In some embodiments, a choice may be made whether to use the original data or data encoded by the above techniques. FIG. 7 shows a circuit according to an exemplary embodiment for selectively using encoding via a logic operation. Specifically, the figure illustrates a block diagram of an encoder 114 (or encoder/decoder 146A/146B) that selectively uses a logic operation. Input data (which may or may not be encoded) are provided to logic circuit 160 and also to one input of MUX 182. Logic circuit 160 processes the data to reduce the run-length, as described above.

In response to a select signal s (labeled as 180), MUX 182 provides as its output signal either the original input data or the processed data at the output of logic circuit 160. In this manner, either the original data or the data processed by logic circuit 160 may be used, as desired, depending on various factors, as persons of ordinary skill in the art would understand.

Figure 8:
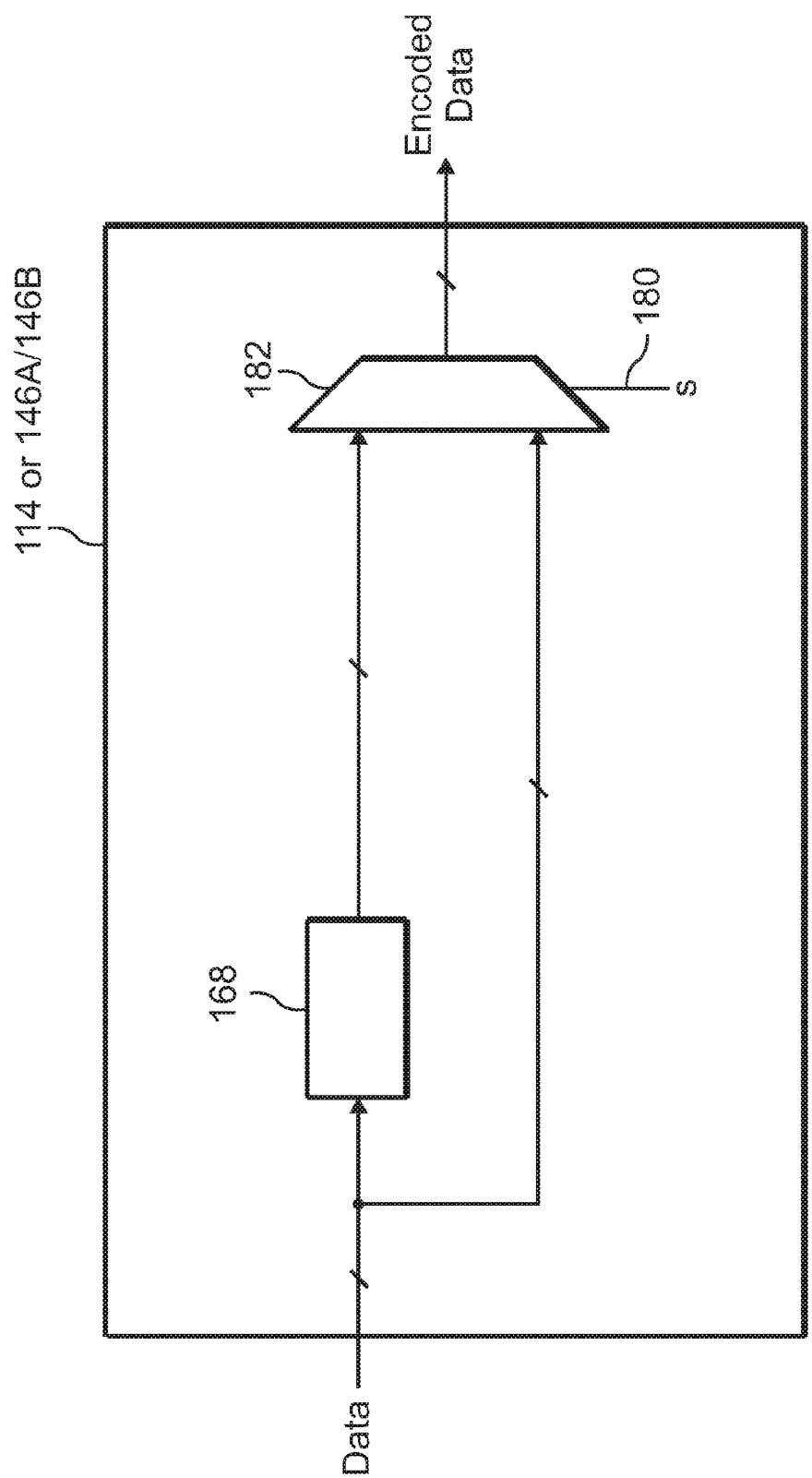
FIG. 8 illustrates a circuit according to an exemplary embodiment for selectively using encoding by bit ordering.

FIG. 8 illustrates a circuit according to an exemplary embodiment for selectively using encoding by bit ordering. Specifically, the figure illustrates a block diagram of an encoder 114 (or encoder/decoder 146A/146B) that selectively uses a bit ordering operation. Input data (which may or may not be encoded) are provided to bit ordering circuit 168 and also to one input of MUX 182. Bit ordering circuit 168 processes the data to reduce the run-length, as described above.

In response to a select signal s (labeled as 180), MUX 182 provides as its output signal either the original input data or the processed data at the output of bit ordering circuit 168. In this manner, either the original data or the data processed by bit ordering circuit 168 may be used, as desired, depending on various factors, as persons of ordinary skill in the art would understand.

Figure 9:
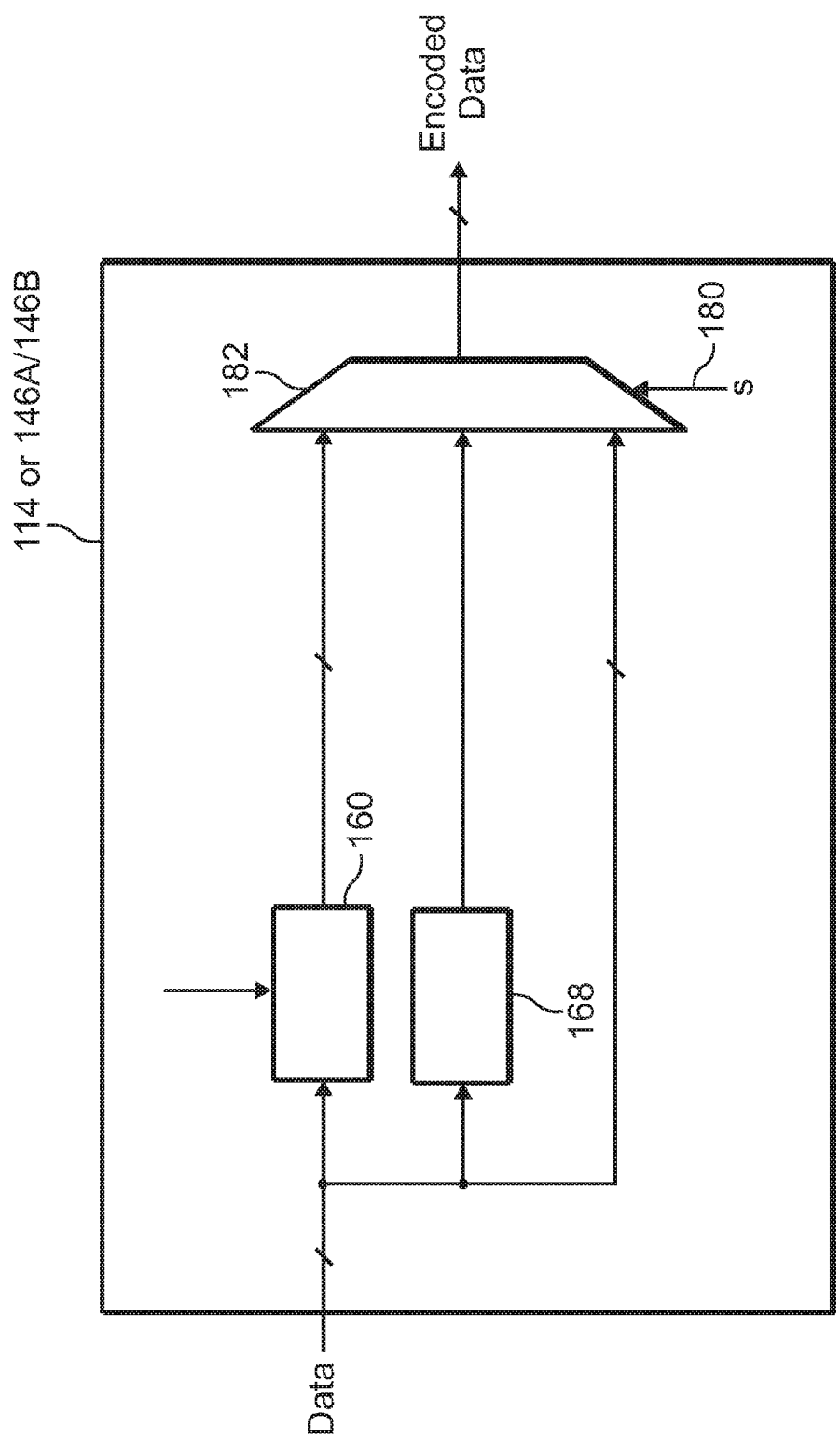
FIG. 9 depicts a circuit according to an exemplary embodiment for selectively using encoding via a logic operation or bit ordering.

FIG. 9 shows a circuit according to an exemplary embodiment for selectively using encoding via a logic operation or bit ordering. This circuit can provide as an output either the original data (which may or may not be encoded), the original data as encoded via a logic operation, or the original data as encoded via bit ordering. Thus, the circuit provides a flexible scheme for selectively encoding the data.

More specifically, the figure illustrates a block diagram of an encoder 114 (or encoder/decoder 146A/146B) that selectively uses encoding via a logic operation or a bit ordering operation. Input data are provided to logic circuit 160, to bit ordering circuit 168, and also to one input of MUX 182. Logic circuit 160 processes the data to reduce the run-length, as described above. Similarly, bit ordering circuit 168 processes the data to reduce the run-length, as described above.

In response to a select signal s (labeled as 180), MUX 182 provides as its output signal either the original data, the processed data at the output of logic circuit 160, or the processed data at the output of bit ordering circuit 168. In this manner, either the original data, the data as processed by logic circuit 160, or the data as processed by bit ordering circuit 168 may be used, as desired, depending on various factors, as persons of ordinary skill in the art would understand.

In this scenario, MUX 182 enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size. Note that in this situation, the MUX select signal, s, includes two bits, which allows the selection of one of the three MUX input signals.

As noted, two or more encoding schemes or techniques may be combined. For example, in some embodiments, the logical operation may be combined with the data bit ordering or bit order scrambling. For instance, in one embodiment, the XOR operation (or another logic operation) may be combined with data bit order scrambling, and to reorder the bits in groups, for example, in groups of 2 (or other desired number). A run in the original payload or data would have transitions (0 to 1 or 1 to 0) every two bits after the XOR operation. Spreading out this new set of data transitions would place an upper bound on the maximum run-length.

Figure 10A:
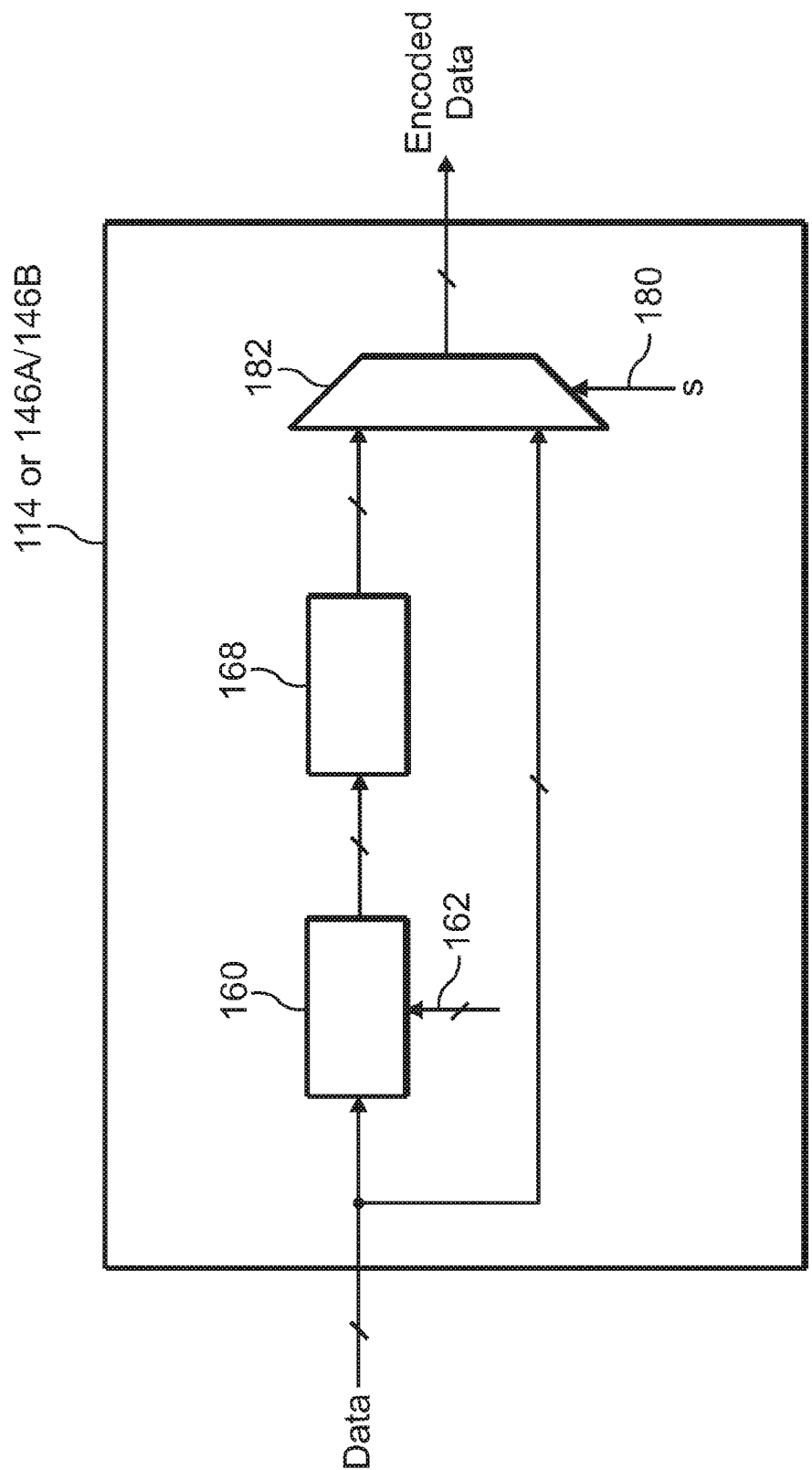
FIGS. 10A-10B illustrate block diagrams of circuits according to exemplary embodiments for performing both a logic operation and a bit ordering scheme to encode data.

FIG. 10A shows a block diagram of an encoder 114 (or encoder/decoder 146A/146B) that uses both the logic operation and the bit ordering scheme. Input data are provided to logic circuit 160 and also to one input of MUX 182. Logic circuit 160 processes the data to reduce the run-length, as described above. The data at the output of logic circuit 160 are provided to bit ordering circuit 168.

Figure 10B:
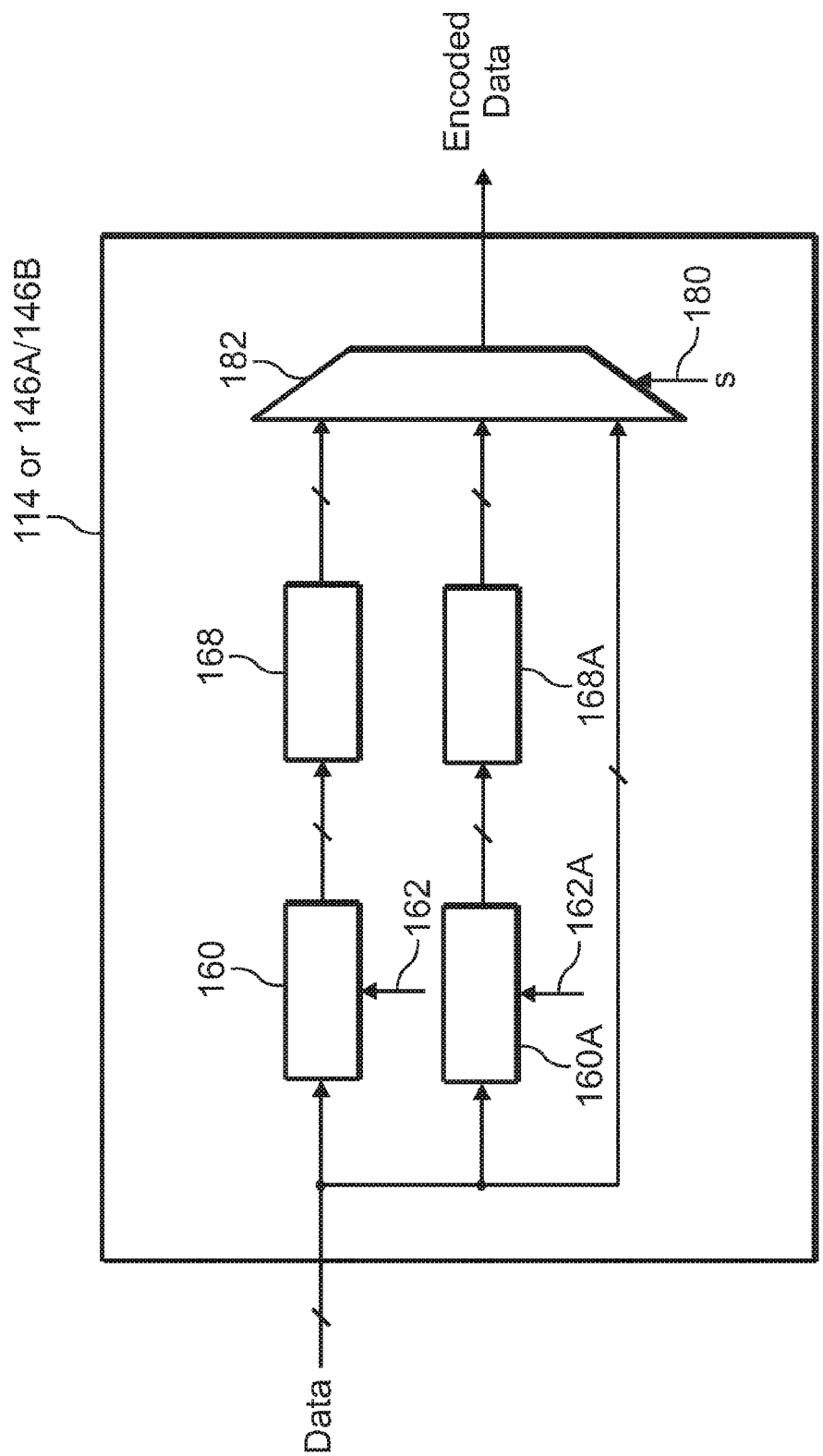

Bit ordering circuit 168 processes the data to reduce the run-length, as described above. The data at the output of bit ordering circuit 168 drive a second input of multiplexer MUX 182. In response to a select signal s (labeled as 180), MUX 182 provides as its output signal either the original data or the processed data at the output of bit ordering circuit 168. In this manner, either the original data or the data processed by logic circuit 160 and bit ordering circuit 168 may be used, as desired, depending on factors such as relative run-length sizes. FIG. 10B shows a block diagram of another encoder 114 (or encoder/decoder 146A/146B) that uses both the logic operation and the bit ordering scheme. The circuit in FIG. 10B includes logic circuit 160 and bit ordering circuit 168, which operate similarly to the respective blocks in the circuit in FIG. 10A. In addition, however, the circuit in FIG. 10B includes logic circuit 160A and bit ordering circuit 168A. Generally, one or both of logic circuit 160A and bit ordering circuit 168A performs a different logic operation or bit ordering operation than do logic circuit 160 and bit ordering circuit 168, respectively. In other words, in response to input signal 162A (which may be the same or different from input signal 162), logic circuit 160A performs a logic operation on the data. Similarly, bit ordering circuit 168A may perform the same or a different bit ordering operation as does bit ordering circuit 168. MUX 182 allows the selection as the encoded data of the original data, the data as encoded by logic circuit 160 and bit ordering circuit 168, or the data as encoded by logic circuit 160A and bit ordering circuit 168A. Thus, the circuit in FIG. 10B allows for a more flexible encoding operation, depending on a desired implementation and end-use. As persons of ordinary skill in the art who have the benefit of the description of the disclosed concepts understand, more than two logic circuits and/or more than two bit ordering circuits may be used, as desired, by making appropriate modifications to the circuit shown.

Figure 11A:
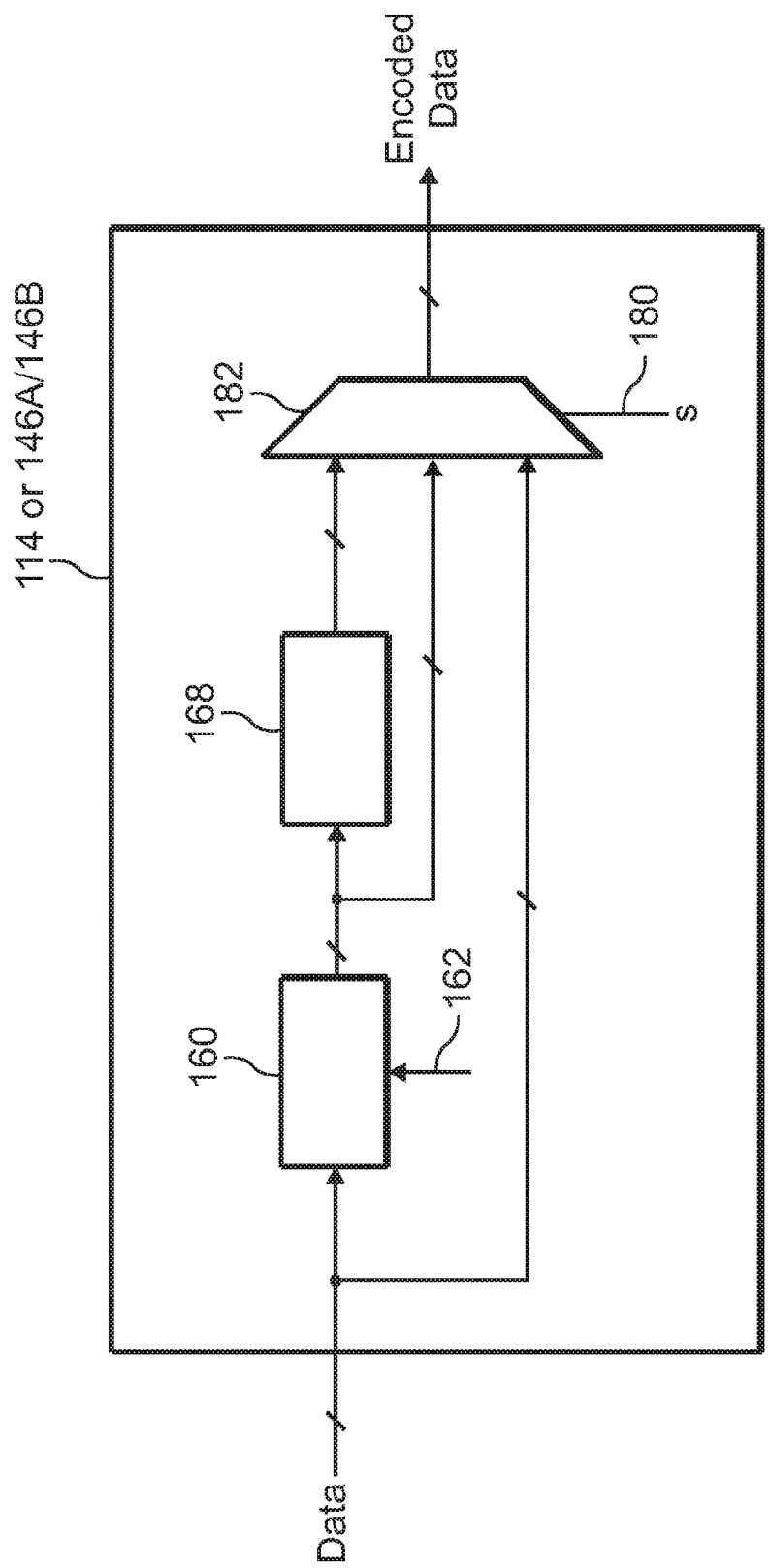
FIGS. 11A-11B show block diagrams of circuits according to exemplary embodiments for selectively performing a logic operation and/or a bit ordering scheme to encode data.
Figure 11B:
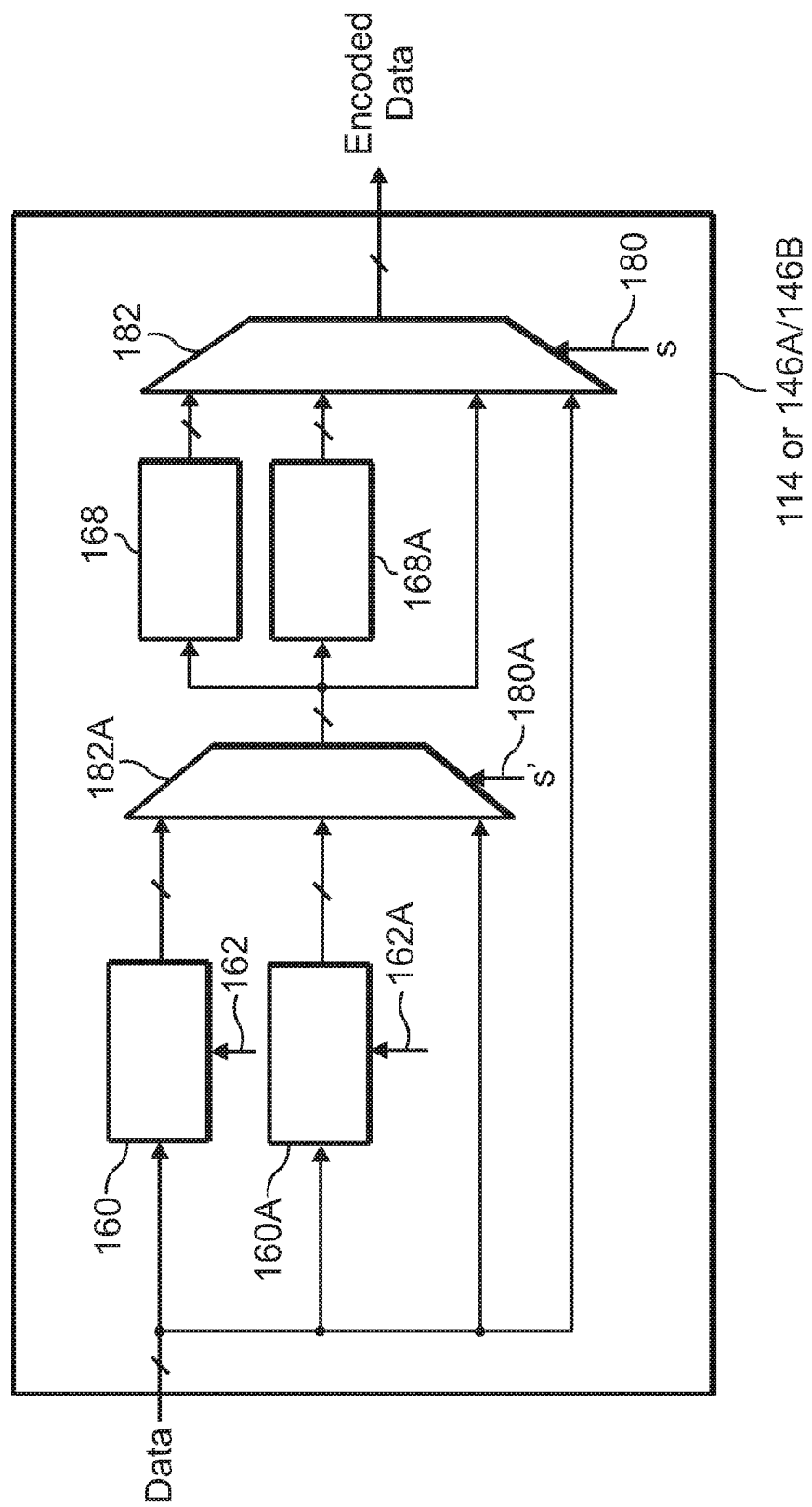

In some embodiments, the output of logic circuit 160 may drive a third input of MUX 182. FIG. 11A illustrates an exemplary embodiment that uses this technique. In this scenario, the MUX enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size. Note that in this situation, the MUX select signal, s, includes two bits, which allows the selection of one of the three MUX input signals. FIG. 11B shows a block diagram of another encoder 114 (or encoder/decoder 146A/146B) that is a variation of the circuit in FIG. 11A. The circuit in FIG. 11B includes logic circuit 160, logic circuit 160A, bit ordering circuit 168, and bit ordering circuit 168A, which operate similarly to the respective blocks in the circuit in FIG. 11A. The encoder circuit in FIG. 11B uses two MUXs, labeled as 182 and 182A. In response to select signal s' (labeled as 180A), MUX 182A enables the selection of three sets of data, i.e., the original data, the data at the output of logic circuit 160A, or the data at the output of bit ordering circuit 168A, and provides the selected input at its output. The output of MUX 182A drives the respective inputs of bit ordering circuits 168 and 168A, and an input of MUX 182. The original data provide an additional input to MUX 182. In response to select signal s (labeled as 180), MUX 182 enables the selection of four sets of data, i.e., the original data, the data at the output of bit ordering circuit 168A, the data at the output of bit ordering circuit 168, and the data at the output of MUX 182A, and provides the selected input at its output as encoded data. Generally, logic circuit 160A may perform a different logic operation than logic circuit 160. In other words, in response to input signal 162A (which may be the same or different from input signal 162), logic circuit 160A performs a logic operation on the data. Similarly, bit ordering circuit 168A may perform a different bit ordering operation than bit ordering circuit 168. Thus, the circuit in FIG. 11B allows for a more flexible encoding operation, depending on a desired implementation and end-use. As persons of ordinary skill in the art who have the benefit of the description of the disclosed concepts understand, more than two logic circuits, more than two bit ordering circuits, and/or more than two MUXs may be used, as desired, by making appropriate modifications to the circuit shown.

A variety of options may be used to provide the select bit(s), s. For example, in some embodiments, the select bit(s) may be provided separately from the data. As another example, in other embodiments, the select bit(s) may be provided on the same lines as the data, for example, as bit(s) that precede the data.

A variety of patterns or operations may be used for the logic operation and/or the ordering operation. The optimal pattern depends on the maximum target or desired run-length and the payload or data size. A variety of logic operations (XOR is one example) may be performed, and a variety of bit patterns (input signal, as shown in FIGS. 3-4) may be used, with a repeating "01" pattern (alternating binary zeros and ones, with a desired length, for example, to match the number of data bits) as one example.

FIG. 12 shows an example of combining data bit order scrambling or reordering together with an XOR operation to reduce run-length. In the example shown, the original data (which may or may not have had some kind of encoding applied to them) have a run-length of 14. The underlined portion shows a string of 14 zeros, giving rise to the run-length of 14. An XOR operation with the data, using a repeating "01" pattern, produces encoded data with a run-length of seven. Note that the XOR operation results in the underlined portion of the original data to become "scattered," or move or spread out through the data.

An additional encoding by using ordering or bit order scrambling with the pattern or order shown, further reduces the run-length to 3 in the output data. The underlined portion of the output data shows the further scattering, moving, or spreading out of the bits that caused the previous higher run-lengths. Thus, the encodings provided by the XOR operation and the ordering operation cause the breaking up or reduction of the relatively long runs of repeating bit patterns, thus reducing the resulting or output run-length.

In some embodiments, instead of, or in addition to, reducing run-length, other metrics or figures of merit may be considered. In some embodiments, metrics other than run-length may be optimized that may reduce the probability of bit error(s) by making the detection of logic ones and zeros easier for the receiver (or the receiving transceiver) in the presence of line noise, signal distortion, or other factors. For example, it may be that bit pattern {00000010000001}, which has a run-length of 6, is more susceptible to bit error than an alternative, such as bit pattern {0100000000010011011}, which has more transitions, but a run-length of 8.

As another example, in some embodiments, metrics related to power dissipation or consumption, in one or more parts (or all of) of communication apparatus (see, for example, FIGS. 1-2) may be included or used. For instance, subject to meeting run-length specifications, it may be preferable to choose the polynomial or pattern that has fewer total transitions in order to reduce dynamic power consumption.

As yet another example, the existence and/or level, number, and/or severity of various system or circuit conditions may be used as a metric. For instance, priority may be given to reducing run-length when relatively high switching activity on one or more neighboring lane(s) exists or is detected. Reducing the run-length may reduce the probably of crosstalk in such a scenario. The priority may be increased, for example, as more switching activity is detected.

An example of another metric is running disparity, which constitutes a measure of the imbalance between 0s and is in the data. For example, a data packet or stream that includes 450 0s and 550 1s (i.e., a total of 450+550, or 1,000 bits) has a running disparity of +100, and an imbalance of (100/1000)×100%, or 10%. With the application of logic operation and bit ordering schemes, relatively short run-lengths, say, less than 10-15, may still occur relatively frequently. Rather than reduce the relatively short run-lengths, the logic operation scheme may be used to optimize or improve a different metric, such as the running disparity (note that the bit reordering scheme should not change the running disparity).

Figure 13:
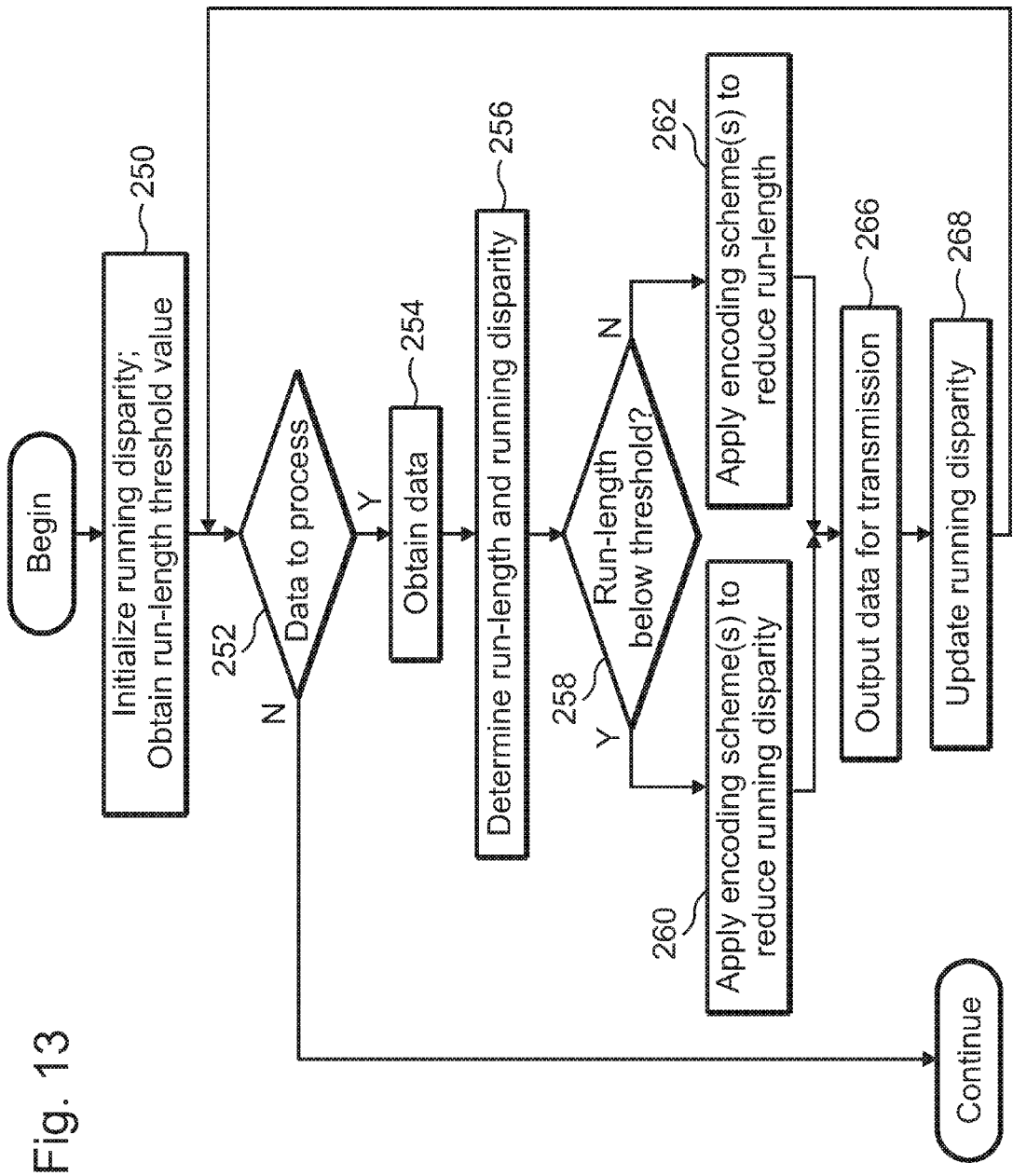
FIG. 13 depicts a flow diagram of a technique for selectively improving running disparity according to an exemplary embodiment.

In some embodiments, the optimization or improvement may be performed based on a set of criteria, such as a threshold value. For example, in some embodiments, running disparity optimization or improvement may be performed for those occurrences (e.g., over 90% of occurrences) where the run-length is below a target threshold. FIG. 13 shows a flow diagram of a technique for selectively improving running disparity according to an exemplary embodiment.

At 250, the running disparity value is initialized. Also, a run-length threshold value is obtained (e.g., from the user, from storage, as a parameter, etc.). Optionally, in some embodiments, a running disparity threshold value may also be obtained (e.g., from the user, from storage, as a parameter, etc.). The running disparity threshold value may optionally be used, as described below.

At 252, a check is made to determine whether data to process are available. If not (e.g., the end of the data transmission has been reached, data transmission has not commenced, etc.), the technique continues with follow-on tasks (if any). If data are available, however, at 254 the data are obtained. The data may or may not have encoding(s) applied to them already. For example, the run-length may have been reduced by using one or more encoding scheme(s), such as those described above.

At 256, the run-length and running disparity for the data are determined. At 258, a determination is made whether the run-length is below the run-length threshold value. If not, then the run-length is relatively high (relative to the threshold used or other desired target or number). Thus, at 262, one or more encoding schemes, such as those described above, may be applied to the data to reduce the run-length.

Optionally, a determination may be made in some embodiments which of several schemes would reduce run-length the most, while also improving running disparity. The encoding scheme(s) may be selected based on that determination and applied to the data.

As another option, in some embodiments a determination is made of the effect of the encoding scheme(s) on running disparity as well as run-length. The encoding scheme(s) that least impact or affect running disparity (e.g., least increase(s) in running disparity) while most impact or affect run-length (e.g., most increase(s) in run-length) may be selected and applied to the data.

Referring to the determination at 258, if the run-length is below the run-length threshold value, then the run-length value may be deemed "tolerable." For instance, consider an embodiment where an XOR operation with a desired bit pattern is applied to the data. The data resulting from an XOR operation (or data resulting from using different bit patterns to perform the XOR operation) have a different running disparity than the data without the XOR operation. In some cases, the running disparity may be deemed relatively high. At 260, one or more encoding schemes, such as those described above, may be applied to the data to reduce the running disparity.

Optionally, a determination may be made in some embodiments which of several schemes would reduce running disparity the most, while also improving run-length. The encoding scheme(s) may be selected based on that determination and applied to the data.

As another option, in some embodiments a determination is made of the effect of the encoding scheme(s) on running disparity as well as run-length. The encoding scheme(s) that least impact or affect run-length (e.g., most increase(s) in run-length) while most impact or affect running disparity (e.g., least increase(s) in running disparity) may be selected and applied to the data.

Alternatively, and optionally, a determination may be made in some embodiments whether the running disparity is below the running disparity threshold value (optionally obtained at 250, as described above). If so, no changes to the data may be made. If not, however, one or more encoding schemes, such as those described above, may be applied to the data to reduce the running disparity. In either case, control passes to 266.

Subsequent to 260 or 262, at 266, the data are output, for example, for transmission to a destination. At 268, the running disparity is updated. The updating of running disparity may optionally be made conditional on a flag, for example, to indicate whether any changes to the data have been made that would affect the running disparity. Subsequently, control returns to 252 to check for data availability, as described above.

By keeping track of the running disparity and choosing the pattern (e.g., the original data or the data with the XOR operation applied) that minimizes the running disparity variation from a baseline or threshold value, the running disparity variation may be minimized, optimized, or generally improved in some embodiments. In some embodiments, in the case of relatively long run-lengths, the pattern or encoding that produces a shorter run-length may be selected (e.g., one or more bit patterns used to perform an XOR operation on the data). In some embodiments, for relatively short run-lengths, the pattern that improves or most improves the balance between 0s and 1s may be selected.

Figure 14:
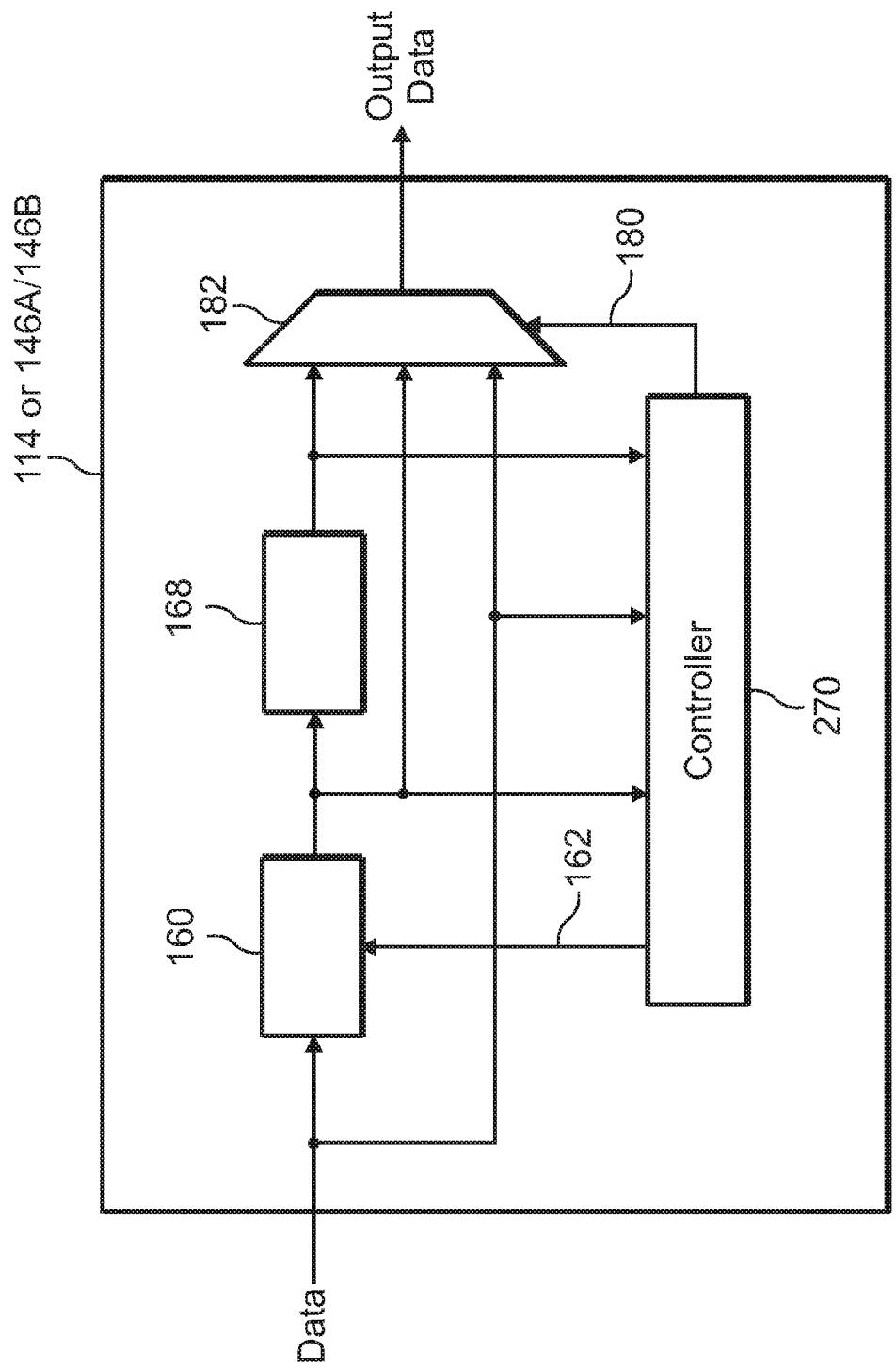
FIG. 14 shows a block diagram of an embodiment for selectively improving running disparity and/or run-length according to an exemplary embodiment.

FIG. 14 depicts a block diagram of a circuit for improving running disparity, run-length, or both, according to an exemplary embodiment. The embodiment shown includes a transmitter 114 (or transceiver 146A or 146B), which includes logic circuit 160, bit ordering circuit 168, MUX 182, and controller 270. The circuit arrangement in the exemplary embodiment shown is configurable and may provide a variety of functions. For example, in some embodiments, the circuit arrangement may provide the functionality shown in the flow diagram of FIG. 13.

Referring to the embodiment shown in FIG. 14, in some variations, one or the other of logic circuit 160 and bit ordering circuit 168 may be used. The choice of configuration depends on the desired encoding, the resulting improvement in run-length and/or running disparity, circuit complexity, and the like, as persons of ordinary skill in the art would understand.

The input data (which may or may not have been encoded) provide one input of MUX 182. The input data also feed an input of controller 270. Controller 270 may base its decision based on any number of criteria. For example, controller 270 may determine the run-length and/or running disparity of the input data. Controller 270 may also consider or look at other factors, including without limitation the average transition density (which would affect power), how uniform the transition density is (which would affect power transients due to non-uniform power demand of the circuit), the location of specific transitions relative to transitions on nearby channels (which could affect cross-talk) or the position of transitions relative to the beginning of a parallel word, which can lead to systematic jitter conditions (deterministic jitter) as may occur at recurring times in a transceiver. Controller 270 may use the result(s) at least in part in determining which of the input signals of MUX 182 should be provided as the output signal of MUX 182. Techniques and circuits for determining various criteria, including run-length and running disparity are well known to persons of ordinary skill in the art.

Depending on select signal 180 (provided by controller 270), MUX 182 may provide the input data as the output data, i.e., without any encoding added or performed. This situation may arise, for example, when controller 270 determines that application of encoding scheme(s) by logic circuit 160 and/or bit ordering circuit 168 does not meet one or more criteria. Controller 270 may make the determination alone or in cooperation with other circuitry (not shown). The criteria may include, without limitation, a specified or desired run-length and/or running disparity. Other criteria may also be used, as persons of ordinary skill in the art would understand.

The input data feed one input of logic circuit 160. Controller 270 provides input signal 162 (e.g., patterns for use in performing logic operation(s)) to logic circuit 160. Logic circuit 160 performs the encoding operation described above on the input data, using input signal 162. Under the control of controller 270, a variety of patterns or logic operations may be implemented by logic circuit 160. For example, in some embodiments, logic circuit 160 may perform an XOR operation between the data and a repeating "01" pattern (input signal 162) or other pattern, as described above.

The result of the logic operation(s), i.e., the output of logic circuit 160, feeds one input of MUX 182. Controller 270 also uses the output of logic circuit 160 to determine its run-length and/or running disparity. Controller 270 may use the result(s) at least in part in determining which of the input signals of MUX 182 should be provided as the output signal of MUX 182.

Bit ordering circuit 168 receives the output of logic circuit 160. Bit ordering circuit 168 performs the encoding operation described above on the output of logic circuit 160. The result of the bit ordering operation, i.e., the output of bit ordering circuit 168, feeds an input of MUX 182. Controller 270 also uses the output of bit ordering circuit to determine its run-length and/or running disparity. Controller 270 may use the result(s) at least in part in determining which of the input signals of MUX 182 should be provided as the output signal of MUX 182.

Controller 270 provides select signal 180 of MUX 182. Select signal 180 of MUX 182, i.e., signal 180, may include more than one bit, depending on the configuration (and inclusion) of logic circuit 160 and bit ordering circuit 168 or based on the inclusion of multiple logic circuits 160 and bit ordering circuits 168, as desired. In the exemplary embodiment shown, MUX 182 enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size, running disparity, etc.

Generally, controller 270 uses the results of determining run-length, running disparity, or both of the input data, the output of logic circuit 160, and/or the output of bit ordering circuit 168. In this manner, controller 270 may use a variety of bit patterns, ordering patterns, and operations to optimize or improve the run-length and/or running disparity of the input data by applying one or more encoding schemes. In exemplary embodiments, controller 270 may be implemented in a variety of ways, as persons of ordinary skill in the art would understand. For example, in some embodiments, controller 270 may include a finite-state machine (FSM). As another example, in some embodiments, controller 270 may include custom logic, a processor (e.g., microprocessor or microcontroller), etc.

As noted, the decision whether to apply one or more encoding scheme(s) and, if so, which encoding scheme(s), patterns, etc., to apply may be based on one or more criteria, as persons of ordinary skill in the art would understand. In some embodiments, such as those described above, the decision whether to apply one or more encoding schemes (or variations of the same scheme) may be based on one or more metrics, such as run-length, running disparity, etc. For example, different XOR patterns or different bit ordering may be used based on determined (or estimated or approximate) run-length, running disparity, etc.

In some embodiments, the decision whether to apply one or more encoding schemes (or variations of the same scheme, for example, different XOR patterns or different bit ordering) may be based on the use of one or more cost functions. This technique may be applied to the embodiments described above. The transmitter (or transceiver) may apply or use one or more cost functions that measure or determine the desirability or cost of using one or more encoding schemes (for example, one cost function per encoding scheme, one cost function for more than one encoding scheme, etc.).

Typically, the lower the cost or the value determined by using the cost function, the more desirable an encoding scheme or operation. Thus, the transmitter (or transceiver) may select one or more cost functions based on their values (say, for a given set of input signals) or the results the cost functions would produce. In this manner, a flexible mechanism may be developed and used for selecting encoding scheme(s) that meet one or more desired criteria.

Depending on the application, a particular or desired implementation, etc., a variety of cost functions may be used, as persons of ordinary skill in the art understand. The cost function may take into account a variety of factors, as persons of ordinary skill in the art understand. Such factors include hardware complexity, software or firmware complexity, processing overhead, delay, speed of processing, the gains (if any) and result(s) of applying the scheme(s) that include the cost function(s), quality of communication between transmitter and receiver (or between transceivers), etc.

Based on the result(s) of the cost function(s), one or more encoding schemes may be applied to the data before transmission to a receiver or transceiver. For example, in the embodiment shown in FIG. 14, controller 270 may use one or more cost functions to determine which encodings (if any) to use (e.g., via MUX 182), what pattern to use as input signal 162, what logic operation to use (in logic circuit 160), what bit ordering to use, etc.

The transmitter (or transceiver transmitting the data) may inform the receiving (or transceiver receiving the data) of the choice of encoding(s). The transmitter (or transceiver transmitting the data) may include one or more additional bits with the transmitted encoded data to indicate the choice of encoding(s) or variations of the same scheme, for example, different XOR patterns or different bit ordering, etc.

Note that the receiver (or receiving transceiver) need not be informed of the cost function or why the transmitter (or transmitting transceiver) used the encoding scheme(s). Note also that, in a bidirectional link, each side of the communication link may use a different cost function for its respective transmitter, as desired.

The additional bit(s) may be included with the data to be transmitted in a number of ways. For example, the additional bit(s) may precede the data or payload. FIG. 15 shows such a configuration according to an exemplary embodiment. Specifically, a set of bits 300 (e.g., a packet) may include one or more bits 302 that constitute the additional bit(s). Bits 302 may be a header, or part of a header, for example, a header in a data packet. The set of bits 300 also includes some bits that constitute the data or payload 304. Bit(s) 302, i.e., the additional bit(s) precede payload 304, i.e., bit(s) 302 are transmitted before payload 304.

As another example, the additional bit(s) may follow the data or payload. FIG. 16 shows such a configuration according to an exemplary embodiment. A set of bits 300 (e.g., a packet) may include one or more bits 302 that constitute the additional bit(s). The set of bits 300 also includes some bits that constitute the data or payload 304. Bit(s) 302, i.e., the additional bit(s) succeed or follow payload 304, i.e., bit(s) 302 are transmitted after payload 304. Put another way, bits 302 may trail the data payload in the set of bits 300, for example, a data packet. Note that a header may also be used, for example, as part of a data packet.

Referring to FIGS. 15-16, a variety of sizes and configurations of data or payloads may be accommodated. To do so, data or payload bits 304 may include a numbers of bits that corresponds to the number of bits in the data or payload. For example, in some embodiments, data bits 304 may include 32 bits, corresponding to a 32-bit payload. In other embodiments, data bits 304 may include 64 bits, corresponding to a 64-bit payload, etc.

Note that in some embodiments the transmitter (or transceiver) and the receiver (or transceiver) may re-negotiate or change, for example, periodically, the agreed-upon or selected type(s) of encoding. The change may occur once, multiple times, at one or more unscheduled points in time, periodically, or according to other schemes, as persons of ordinary skill in the art understand.

The above description of the data or packet structures assumes a serial communication channel or medium. In other words, the bits of information travel along one communication link, for example, via two conductors or coupling mechanisms (one ground, one signal) for a single-ended link or via three conductors or coupling mechanisms (one ground, one each for the differential signals) for a differential link. Other variations are possible, as persons of ordinary skill in the art would understand.

Techniques may be used to reduce information processing overhead, complexity, and/or cost, and/or increase throughput, or make trade-offs among those attributes. In some embodiments, a decision on whether to use any encoding scheme(s) or which encoding scheme(s)/pattern(s) to use relies on a calculation of run-length. Calculation of run-length entails providing and using some hardware or circuitry (or perform the calculations via firmware or software, where the performance is acceptable). Such embodiments trade off higher complexity and cost for increased encoding performance.

In other embodiments, rather than a calculation of run-length, an approximation of run-length may be used. Using an approximated run-length may be cheaper, and may reduce gate-count. As an example, the calculation of run-length may be performed on two or more sets of data bits within a data packet or payload.

Figure 17:
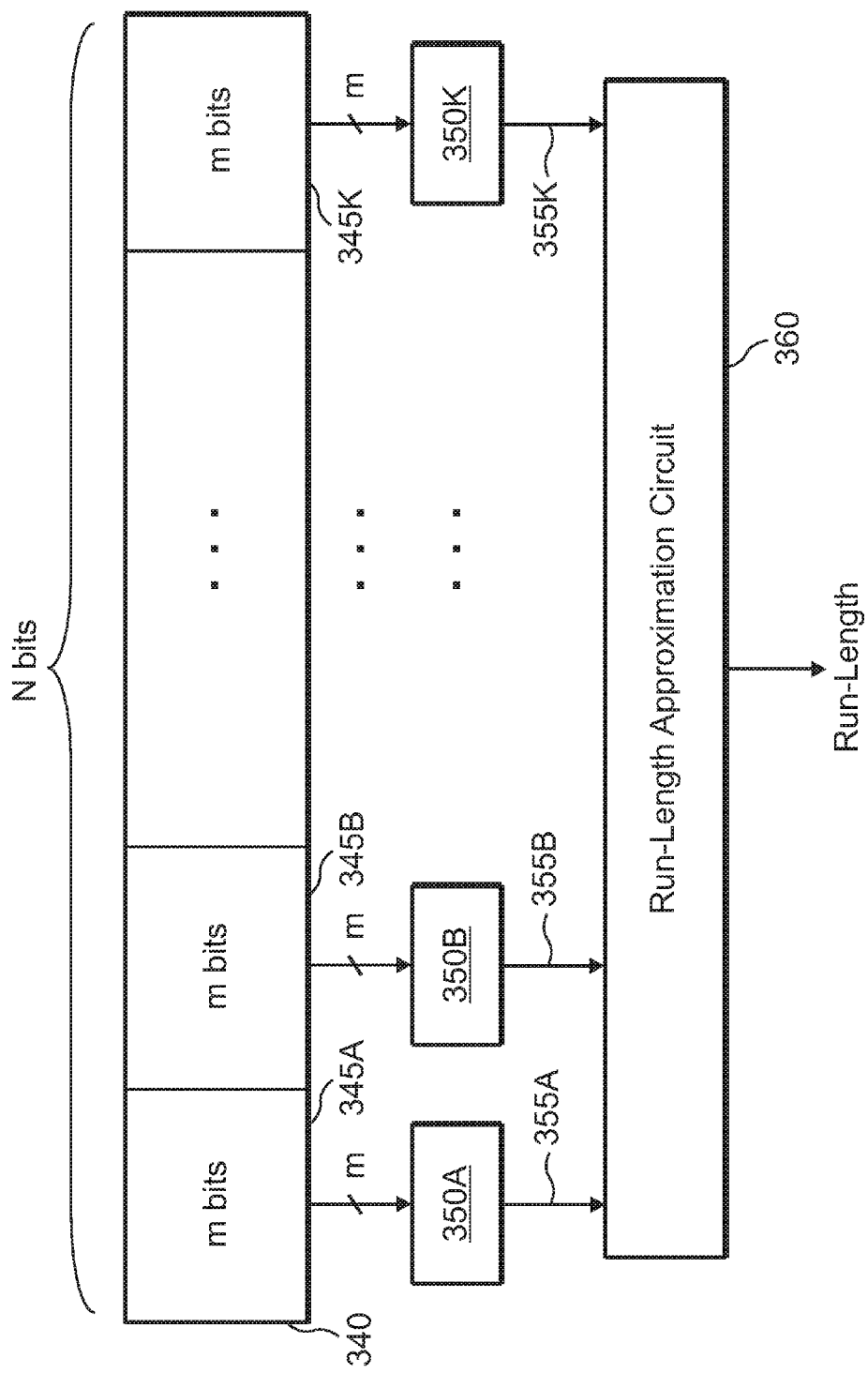
FIG. 17 depicts a block diagram of a circuit for approximating run-length according to exemplary embodiment.

Generally, an N-bit payload may be divided into k sets or subsets of m bits each (or a variable number of bits, if desired). Run-length may then be calculated using the k sets. FIG. 17 shows a block diagram of a circuit for approximating run-length according to this scheme. The circuit includes logic circuits 350A-350K. Logic circuits 350A-350K may reside in an encoder (e.g., encoder 114 in FIG. 1, or encoder/decoder 146A/146B in FIG. 2), or at other appropriate locations in a circuit or system, as desired.

Referring to FIG. 17, in the embodiment shown, a data packet or payload 340 includes a set of N data bits that are divided into sets 1 through k (labeled 345A-345K) of m bits. (Note that the example shown does not illustrate other bits, such as additional bits, described above.) Logic circuits 350A-350K operate on a respective set of m bits (labeled 345A-345K), and calculate respective outputs based on the sets. Outputs 355A-355K of logic circuits 350A-350K provide the respective outputs based on bit sets 345A-345K.

For each group of m bits, a respective one of logic circuits 350A-350K determines whether the respective group of bits is all logic zeros or all logic ones. In exemplary embodiments, logic circuits 350A-350K may include m-input AND gates and/or m-input OR gates. The m-input AND gates produce at logic one output if all m bits in a respective group of bits have logic one values. Conversely, the m-input OR gates produce at logic zero output if all m bits in a respective group of bits have logic zero values. By using this technique, the complexity and, hence, cost of the run-length calculations may be reduced. In other words, because each of run-length calculation circuits 350A-350K operates on m bits, rather than N bits (where N>m), this technique eases burden or calculation complexity of the run-length calculation.

As an example, consider the data bits shown in FIG. 18, corresponding to 7 (i.e., K=7) groups of 4 bits each (i.e., m=4), and the associated outputs of logic circuits 350A-350K. The "X" outputs denote situations where all m bits in a group of bits do not have the same logic value, whereas the "0" and "1" outputs denote, respectively, situations where all m bits in a group of bits have logic zero and logic one values. When looking at groups of four bits, groups 3-6 include all logic zeros, and therefore there is a run-length of four groups. Group 7 includes all logic ones, but is not included because its constant value of logic ones is different than the groups of logic zeros. Run-length approximation circuit 360 then estimates the run-length of the data bits by using the output of logic circuits 350A-350K. The combined run-length calculation now works on a dataset that is reduced in effective length by four. Note that from the outputs of logic circuits 350A-350K one may determine that the run-length in the data bits is at least 16. Given that the last two logic zero values in the second group of bits are not counted, no difference in this case between run-lengths of 16 and 18 would be determined. The worst-case error occurs when there is a run-length of (group_size−1), i.e., (m−1), in both end groups of bits. In that case, the maximum error would be 2×3, or 6, for the situation where m=1. This situation occurs, for example, if the pattern for logic zeros is 1000 0000 0001. Persons of ordinary skill in the art understand that the examples provided are merely illustrative, and other configurations may be used, such as other values of m, k, and N, and including situations where the k sets of data bits may include variable numbers of bits, rather than all include an equal number of bits, etc., as desired.

Note that the receiver (or receiving transceiver) performs decoding based on the encoding bit(s) (the additional bit(s) described above) or an agreed-upon or negotiated communication mechanism or protocol. Thus, the receiver (or receiving transceiver) need not know the decision criteria used by the transmitter (or transmitting transceiver), such as using exact or approximate run-lengths, etc., assuming that the overall communication link meets certain criteria (e.g., provides sufficient transitions, running disparity, etc.).

Consequently, different transmitters/transceivers, for example, as implemented in different ICs, may use different levels of accuracy in calculating the run-length in determining what (if any) encoding scheme(s) to use. In addition, different transmitters/transceivers may use different techniques or criteria for determining when to use a given encoding scheme, pattern, etc, which may provide additional flexibility.

Similarly, the transmitter/transceiver may change its threshold rules for balancing DC-balance or running disparity versus run-length without that change resulting in any change in the receiver. The transmitter/transceiver may also choose to change these heuristics (selecting/changing encoding scheme(s), running disparity, etc.) based on what maximizes or improves the quality of the link (e.g., BER measures). Such tuning may be performed manually, or may based on measures of link quality (e.g., real-time or periodic feedback on the quality of the communication link and the communication between transmitter and receiver or between transceivers).

As noted, in some embodiments, one or more bits may be used to indicate the existence and/or type of encoding scheme(s)/parameter(s) (e.g., patterns) used. Such additional bit(s) may be used to inform the receiver or receiving transceiver of decision(s) made by the transmitter or transmitting transceiver. The additional bit(s) may also be used to perform more than one function. Specifically, the bit(s) may be used to initiate or establish communication or word lock or synchronization between a transmitter (or transmitting transceiver) and a receiver (or receiving transceiver). Once communication or word lock or synchronization is established, the bit(s) may be used for other purposes. Such purposes include selection of one or more encoding scheme(s), pattern(s) used, etc., as described in detail in this document. In some embodiments, such bit(s) may be included in a data or packet header.

In some embodiments, this technique may be used to improve conventional communication techniques/protocols. For example, the 64/66 and 64/67 encoding protocols use the transition on the header to indicate word-boundaries. Thus, in the 64/66 protocol, header bits "01" indicate data, and "10" bit indicate control information ("00" and "11" are illegal states). In the 64/67 protocol, the header bits x01 indicate data, and x10 indicate control information ("x00" and "x11" are illegal states), where x can be either logic 0 or logic 1. Once word-lock is established between the communicating devices (e.g., transmitter/receiver or transceiver/transceiver), the header bits may be used for other purposes.

In some embodiments, the header bits may be used initially to establish or initiate communication (e.g., using 64/66 encoding) but, once communication has begun, the header bits may be used to communicate additional information about decisions made by the transmitter/transceiver, as described above (e.g., encoding scheme(s), pattern(s) used, etc.). Thus, the unused or illegal header bits/header bit states, for example, "00" and/or "11" may be used in some embodiments for dual purposes.

Note that the receiver (or receiving transceiver) need not know when the transition between the two uses of the header bit(s) may happen, but rather that it will happen sometime after word-lock occurs or communication has been successfully initiated. The transmitter refrains from using the alternative encodings that would use or require header bits 00 or 11 prior to word-lock being established. This establishment of word-lock could be based on a timer where the transmitter assumes the receiver will have achieved word-lock after a pre-determined number of words, or it could be done via direct communication, as desired. The transition between the two uses of header bit(s) may occur more than once. For example, suppose that the transmitter (or transmitting transceiver) is informed that the receiver (or receiving transceiver) failed to receive a sufficiently large number of packets or that receiver (or transmitting transceiver) word-lock was lost. The transmitter (or transmitting transceiver) may revert to using the header bits for establishing or initiating communication.

Once word lock has been established or communication initiated, the receiver (or receiving transceiver) may indicate to the transmitter (or transmitting transceiver) that it is receiving data. The transmitter (or transmitting transceiver) may then revert to using the header bits for communicating other information (e.g., encoding scheme(s), pattern(s) used, etc.) to the receiver (or receiving transceiver).

Figure 19:
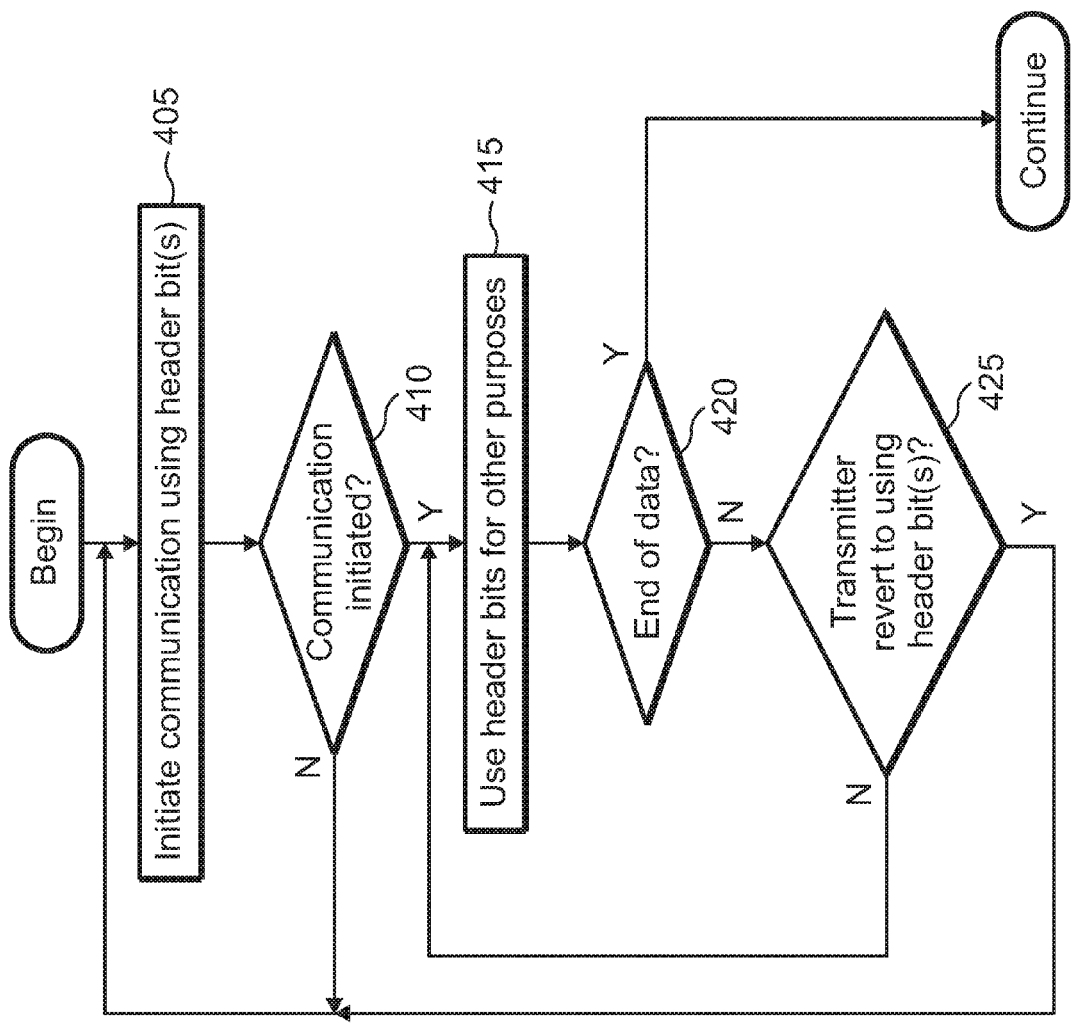
FIG. 19 shows a flow diagram of a technique for providing communication via a link according to an exemplary embodiment.

FIG. 19 shows a flow diagram of using headers according to an exemplary embodiment. The various operations shown in the flow diagram may be implemented in a variety of ways and using various communication protocols or encoding techniques, as persons of ordinary skill in the art would understand. At 405, an attempt is made to initiate communication, using the header bit(s), as described above. At 410, a check is made to determine whether the attempt to initiate communication succeeded. If not, another attempt is made by returning to 405. If communication has been initiated, at 415 the header bits are used for other purposes, as described above, for example, to communicate decision(s) on encoding scheme(s), pattern(s) used, etc.

At 420, a check is made to determine whether the data have ended (e.g., no more data exist to communicate), or communication should be terminated, for whatever reason. If so, communication ends. If not, at 425 a check is made to determine whether the transmitter should revert back to not choosing or using the alternative coding, for example, as indicated by 00 or 11, as described above, for example, because of loss of word lock or synchronization, lack of successful communication of all data, etc. (note that, after reverting back, the encoding will be as good as before the application of this technique). If so, at 410 the use of the header bit(s) is reverted.

As persons of ordinary skill in the art would understand, one may apply the disclosed concepts effectively to various types of encoding. For example, use the disclosed techniques to modify and improve traditional encoding techniques. Examples provided constitute merely illustrative applications, and are not intended to limit the application of the disclosed concepts to other situations or scenarios.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus, comprising:
an encoder circuit adapted to encode data bits for transmission via a communication link, wherein the data bits have a run-length, the encoder circuit comprising:
a logic circuit that selectively performs a logic operation on a pattern of bits and the data bits based on an approximation of the run-length of the data bits in order to reduce the run-length of the data bits; and
a bit order scrambling circuit that selectively performs a bit scrambling operation on the data bits based on the approximation of the run-length of the data bits to scramble an order of the data bits, that is connected in series with the logic circuit, and that receives an output of the logic circuit.

2. The apparatus according to claim 1, wherein the logic operation comprises an exclusive OR (XOR) operation.

3. The apparatus according to claim 2, wherein the pattern of bits comprises alternating binary zeros and ones.

4. The apparatus according to claim 1, wherein the logic operation is selectively performed based on one or more of: (a) a cost function, (b) a power consumption of the apparatus, and (c) a running disparity of the apparatus.

5. The apparatus according to claim 1, wherein the logic operation is selectively performed based on a value of a set of bits.

6. The apparatus according to claim 5, wherein the set of bits are included in a header of a packet that includes the data bits.

7. The apparatus according to claim 5, wherein the set of bits comprises a single bit.

8. The apparatus according to claim 1, wherein the order of the data bits is selectively scrambled in order to reduce the run-length of the data bits.

9. The apparatus according to claim 1, wherein the bit order scrambling circuit selectively scrambles the order of the data bits based on one or more of: (a) a cost function, (b) a power consumption of the apparatus, and (c) a running disparity of the apparatus.

10. The apparatus according to claim 9, wherein the logic operation and the bit scrambling operation are performed selectively based on a value of a set of bits.

11. The apparatus according to claim 1, further comprising a transmitter circuit coupled to the encoder circuit.

12. An apparatus, comprising:
an encoder circuit adapted to encode data bits for transmission via a communication link, wherein the data bits have a run-length, the encoder circuit comprising:
a bit order scrambling circuit that selectively scrambles an order of the data bits based on an approximation of the run-length of the data bits in order to reduce a run-length of the data bits; and
a logic circuit that selectively performs a logic operation on the data bits based on the approximation of the run-length of the data bits to reduce the run-length of the data bits and that is connected in parallel with the bit order scrambling circuit.

13. The apparatus according to claim 12, wherein the bit order scrambling circuit selectively scrambles the order of the data bits based on one or more of: (a) a cost function and (b) a running disparity of the apparatus.

14. The apparatus according to claim 12, wherein the logic operation comprises an exclusive OR (XOR) operation.

15. The apparatus according to claim 12, wherein the logic operation is selectively performed based on one or more of: (a) a cost function and (b) a running disparity of the apparatus.

16. The apparatus according to claim 12, wherein the encoder circuit is part of an encoder/decoder.

17. An apparatus, comprising:
an encoder to encode a set of data bits, wherein the set of data bits has a run-length, wherein the encoder is adapted to encode the data bits selectively based on a set of header bits, and wherein the set of header bits is used initially to establish data communication via a link, the encoder circuit comprising:
a logic circuit that selectively performs a logic operation on the set of data bits based on an approximation of the run-length to reduce the run-length of the set of data bits; and
a bit order scrambling circuit that selectively performs a bit scrambling operation on the set of data bits based on the approximation of the run-length to scramble an order of the set of data bits.

18. The apparatus according to claim 17, wherein the set of header bits is included in a header.

19. The apparatus according to claim 18, wherein the set of header bits comprises two bits.

20. The apparatus according to claim 18, wherein the header comprises a 64/66 header.

21. The apparatus according to claim 17, wherein the set of header bits is used initially to establish word-lock.

22. The apparatus according to claim 17, wherein the set of header bits is used to encode the data bits after communication via the link has been established.

23. The apparatus according to claim 22, wherein the logic operation is performed based further on the value of the set of header bits after communication has been established.

24. The apparatus according to claim 22, wherein the bit order scrambling circuit scrambles the order of the data bits based further on the value of the set of header bits after communication has been established.

* * * * *